US009472424B2

(12) United States Patent
Hamano et al.

(10) Patent No.: US 9,472,424 B2
(45) Date of Patent: Oct. 18, 2016

(54) SUBSTRATE PROCESSING APPARATUS AND A METHOD OF MANUFACTURING A SEMICONDUCTOR DEVICE

(71) Applicant: HITACHI KOKUSAI ELECTRIC INC., Tokyo (JP)

(72) Inventors: Katsuyoshi Hamano, Toyama (JP); Yasutoshi Tsubota, Toyama (JP); Masayuki Tomita, Toyama (JP); Teruo Yoshino, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 14/958,517

(22) Filed: Dec. 3, 2015

(65) Prior Publication Data
US 2016/0086818 A1 Mar. 24, 2016

Related U.S. Application Data

(63) Continuation of application No. 13/409,783, filed on Mar. 1, 2012, now Pat. No. 9,236,246.

(30) Foreign Application Priority Data

Mar. 4, 2011 (JP) ................................. 2011-047166
Apr. 26, 2011 (JP) ................................. 2011-098103

(51) Int. Cl.
*C23C 16/00* (2006.01)
*H01L 21/324* (2006.01)
(Continued)

(52) U.S. Cl.
CPC .............. *H01L 21/324* (2013.01); *C23C 16/46* (2013.01); *C23C 16/52* (2013.01);
(Continued)

(58) Field of Classification Search
USPC ............ 438/707, 765; 118/696; 257/E21.24, 257/E21.483
See application file for complete search history.

(56) References Cited

U.S. PATENT DOCUMENTS 5,891,350 A 4/1999 Shan et al.
2004/0137397 A1 7/2004 Cox
(Continued)

FOREIGN PATENT DOCUMENTS

JP 63-079636 U 5/1988
JP 63-124424 A 5/1988
(Continued)

OTHER PUBLICATIONS

Non-Final Rejection of U.S. Appl. No. 13/409,783, filed Apr. 17, 2015.*
(Continued)

*Primary Examiner* — Telly Green
(74) *Attorney, Agent, or Firm* — Volpe and Koenig, P.C.

(57) ABSTRACT

The temperature of a substrate is elevated rapidly while improving the temperature uniformity of the substrate. The substrate is loaded into a process chamber, the loaded substrate is supported on a first substrate support unit, a gas is supplied to the process chamber, the temperature of the substrate supported on the first substrate support unit is elevated in a state of increasing the pressure in the process chamber to higher than the pressure during loading of the substrate or in a state of increasing the pressure in the process chamber to higher than the pressure during processing for the surface of the substrate, the substrate supported on the first substrate support unit is transferred to the second substrate support unit and supported thereon after lapse of a predetermined time, and the surface of substrate is processed while heating the substrate supported on the second substrate support unit.

8 Claims, 9 Drawing Sheets

(51) Int. Cl.

| | |
|---|---|
| *C23C 16/46* | (2006.01) |
| *C23C 16/52* | (2006.01) |
| *H01J 37/32* | (2006.01) |
| *H01L 21/02* | (2006.01) |
| *H01L 21/67* | (2006.01) |
| *H01L 21/687* | (2006.01) |
| *H01L 21/306* | (2006.01) |

(52) U.S. Cl.
CPC .. *H01J 37/32669* (2013.01); *H01J 37/32724* (2013.01); *H01L 21/0262* (2013.01); *H01L 21/02247* (2013.01); *H01L 21/02301* (2013.01); *H01L 21/30604* (2013.01); *H01L 21/67115* (2013.01); *H01L 21/67253* (2013.01); *H01L 21/68742* (2013.01)

(56) References Cited

U.S. PATENT DOCUMENTS

| | | |
|---|---|---|
| 2006/0236932 A1 | 10/2006 | Yokogawa et al. |
| 2007/0243652 A1 | 10/2007 | Bour et al. |
| 2008/0194111 A1 | 8/2008 | Delgadino et al. |
| 2010/0096084 A1 | 4/2010 | Lee et al. |
| 2010/0184299 A1 | 7/2010 | Takahashi |

FOREIGN PATENT DOCUMENTS

| | | |
|---|---|---|
| JP | 03-135011 A | 6/1991 |
| JP | 04-307734 A | 10/1992 |
| JP | 10-070109 A | 3/1998 |
| JP | 10-245680 A | 9/1998 |
| JP | 2000-058518 A | 2/2000 |
| JP | 2001-179078 A | 7/2001 |
| JP | 2002-203839 A | 7/2002 |
| JP | 2003-273088 A | 9/2003 |
| JP | 2005-538566 A | 12/2005 |
| JP | 2006-303309 A | 11/2006 |
| JP | 2009-088348 A | 4/2009 |
| JP | 2009-152233 A | 7/2009 |
| JP | 2010-161350 A | 7/2010 |

OTHER PUBLICATIONS

Japanese Office Action dated Mar. 31, 2015 of Counter part Application No. JP 2011-098103.

\* cited by examiner

SUBSTRATE PROCESSING APPARATUS AND A METHOD OF MANUFACTURING A SEMICONDUCTOR DEVICE

FIELD OF THE INVENTION

The present invention concerns a substrate processing apparatus and a method of manufacturing a semiconductor device.

BACKGROUND OF THE INVENTION

In the step of manufacturing semiconductor devices, a substrate processing apparatus of performing processing such as nitridation, oxidation, and annealing by heating the substrate is adopted. The substrate processing apparatus described above has, for example, a substrate support unit provided in a process chamber for processing a substrate and supporting the substrate, and a heating unit for heating the substrate, in which the substrate loaded into the process chamber is placed on the substrate support unit and the substrate is processed while being heated by the heating unit. Such a heating unit is sometimes provided, for example, in the substrate support unit or in the upper portion of the process chamber.

SUMMARY OF THE INVENTION

In the substrate processing apparatus having the heating unit as described above, it may be considered that the substrate is heated from various directions such as on the side of the substrate support unit or on the side of the upper portion of the process chamber, or on both sides of the substrate support unit and the upper portion of the process chamber. However, when the substrate is loaded into the process chamber and transferred to the substrate support unit, for example, only one surface (lower surface) of the substrate is in contact with the substrate support unit. Then, when the substrate is heated in any of the directions, the degree of heating is different between the surface in contact with the substrate support unit (lower surface) and another non-contact surface (upper surface), and the temperature elevation rate is sometimes different between the upper and the lower surfaces of the substrate. This sometimes lowers the temperature uniformity of the substrate.

Besides, in the existent substrate processing apparatus, it was difficult to increase the thickness of a film formed on the surface of a wafer without greatly changing the process condition, for example, the flow rate of a processing gas, temperature in the process chamber, high frequency power, etc.

The present invention intends to provide a substrate processing apparatus and a method of manufacturing a semiconductor device capable of rapidly increasing the temperature of a substrate while improving the temperature uniformity of the substrate.

The present invention provides, in a first typical aspect, a substrate processing apparatus comprising:

a process chamber for processing a substrate, a first substrate support unit for supporting the substrate loaded into the process chamber, a second substrate support unit provided in the process chamber for supporting the substrate transferred from the first substrate support unit, a heating unit for heating the substrate loaded into the process chamber, a gas supply unit for supplying a gas to the process chamber, a gas exhaustion unit for exhausting the gas from the inside of the process chamber, and a control unit for controlling the first substrate support unit, the heating unit, the gas supply unit, and the gas exhaustion unit, or controlling the second substrate support unit, the heating unit, the gas supply unit, and the gas exhaustion unit, in which the control unit is a unit that performs control for supporting the substrate loaded into the process chamber on the first substrate support unit so as to be spaced apart from the second substrate support unit, supplying a gas from the gas supply unit to the process chamber, heating to elevate the temperature of the substrate supported on the first substrate support unit by the heating unit, transferring the substrate supported on the first substrate support unit after lapse of a predetermined time to the second substrate support unit, and processing the substrate supported on the second substrate support unit while heating by the heating unit, and performs control for increasing the pressure in the process chamber during elevation of the temperature of the substrate supported on the first substrate support unit to higher than the pressure during loading of the substrate, or increasing the pressure in the process chamber during elevation of the temperature of the substrate supported on the first substrate support unit to higher than the pressure when the substrate supported on the second substrate support unit is processed.

The present invention provides, in another typical aspect, a method of manufacturing a semiconductor device including the steps of:

loading a substrate into a process chamber for processing the substrate and supporting the substrate on a first substrate support unit, elevating the temperature of the substrate supported on the first substrate support unit for a predetermined time, transferring the substrate supported on the first substrate support unit to a second substrate support unit provided in the process chamber after the step of elevating the temperature of the substrate, processing the surface of the substrate transferred to the second substrate support unit while heating, and unloading the substrate processed in the step of processing the surface of the substrate from the inside of the process chamber, in which in the step of loading the substrate, the substrate loaded into the process chamber is supported on the first substrate support unit above the second substrate support unit so as to be spaced apart from the second substrate support unit, and in the step of elevating the temperature of the substrate, a gas is supplied to the process chamber and a pressure in the process chamber is increased to higher than the pressure in the step of loading the substrate or higher than the pressure in the step of processing the surface of the substrate.

The present invention provides a substrate processing apparatus and a method of manufacturing a semiconductor device capable of elevating a temperature of a substrate at a high speed while improving the uniformity of the temperature of the substrate.

DETAILED DESCRIPTION OF THE PREFERRED EMBODIMENTS

First Embodiment (1) Configuration of a Substrate Processing Apparatus

Figure 1:
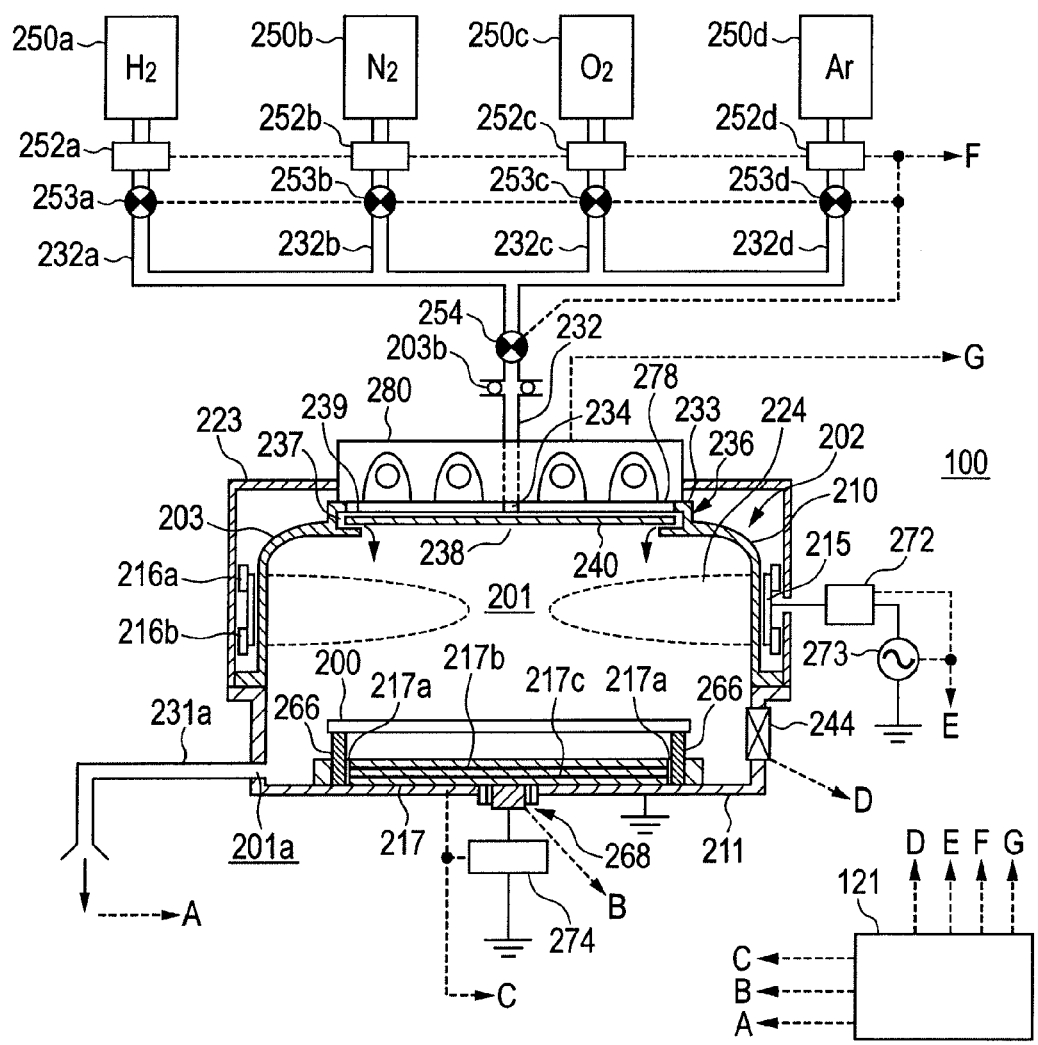
FIG. 1 is a cross sectional view showing a state of loading a substrate in a substrate processing apparatus according to a first embodiment of the invention.
Figure 2:
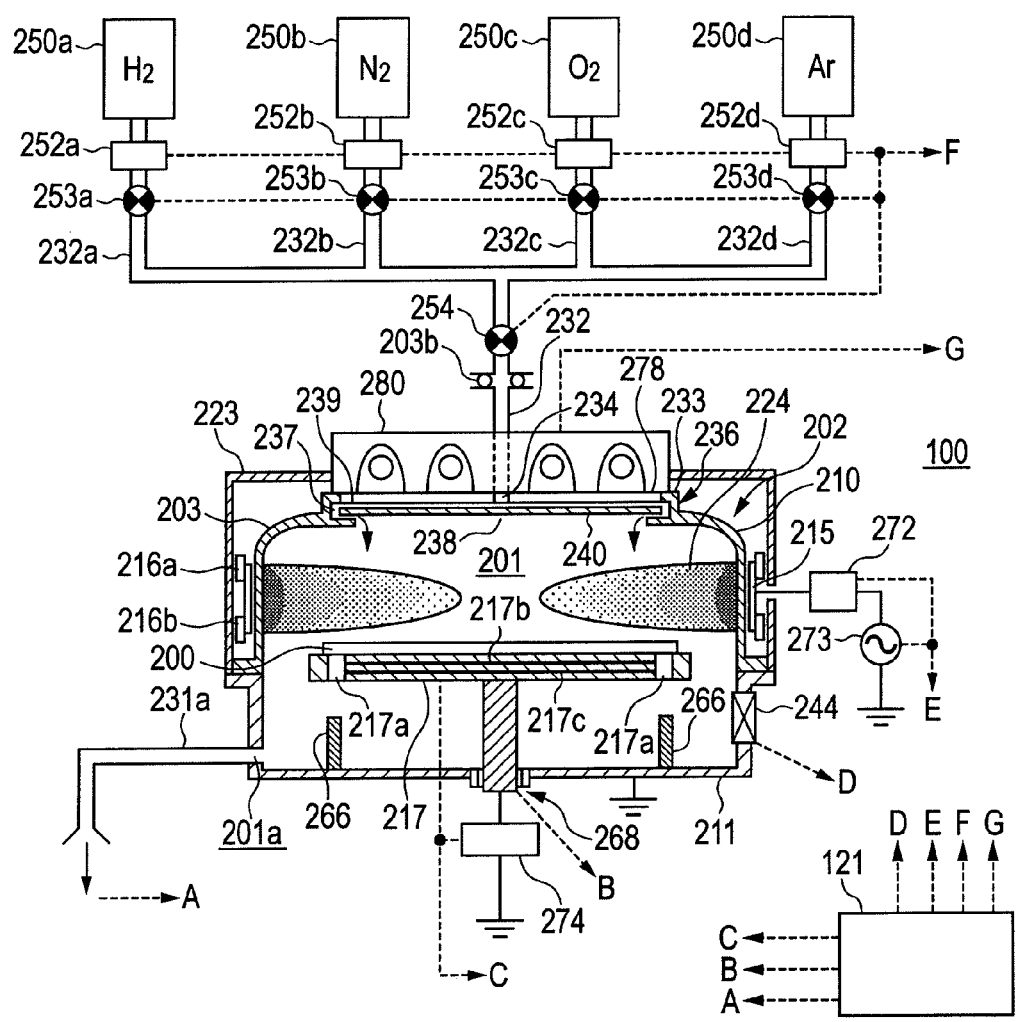
FIG. 2 is a cross sectional view showing a state of processing the substrate in the substrate processing apparatus according to the first embodiment of the invention.

A substrate processing apparatus according to a first embodiment of the invention is to be described with reference to FIG. 1 and FIG. 2. FIG. 1 is a view for a modified magnetron typed plasma processing apparatus as a substrate processing apparatus according to the first embodiment, which is a cross sectional view showing the state of loading a substrate. FIG. 2 is a cross sectional view showing the state of processing the substrate in the substrate processing apparatus according to the first embodiment.

The substrate processing apparatus according to the first embodiment is a modified magnetron typed plasma Processing Apparatus (hereinafter referred to as an MMT apparatus) for plasma processing a wafer 200 such as a silicon (Si) substrate by using a modified magnetron typed plasma source for generating high density plasmas by electric fields and magnetic fields. The MMT apparatus 100 is configured such that a wafer 200 is loaded into a process chamber 201 kept in an airtight state and a high frequency voltage is applied under a predetermined pressure to various types of gases supplied in the process chamber 201 to cause magnetron discharge. The MMT apparatus 100, having such a configuration can perform various plasma processings, for example, exciting a processing gas, etc. thereby performing diffusion processing such as oxidation or nitridation, forming a thin film to the wafer 200, or etching the surface of the wafer 200.

(Process Chamber)

The MMT apparatus 100 has a process furnace 202 for plasma processing the wafer 200. A process vessel 203 constituting the process chamber 201 is provided in the process furnace 202. The process vessel 203 has a dome-shaped upper vessel 210 as a first vessel, and a cup-shaped lower vessel 211 as a second vessel. The process chamber 201 is formed by disposing the upper vessel 210 over the lower vessel 211. The upper vessel 210 is formed of a non-metal material, for example, aluminum oxide ($Al_2O_3$) or quartz ($SiO_2$) and the lower vessel 211 is formed, for example, of aluminum (Al).

A gate valve 244 is provided to the lower side wall of the lower vessel 211. The gate valve 244 is configured such that the wafer 200 can be loaded into the process chamber 201 by using a transport mechanism (not illustrated) when the gate is opened or the wafer 200 can be unloaded to the outside of the process chamber 201 when the valve is opened. The gate valve 244 is also configured such that it functions as a shut-off valve for keeping the inside of the process chamber 201 airtight when the valve is closed.

(Susceptor)

At the central portion on the bottom of the process chamber 201, a susceptor 217 as a second substrate support unit for supporting the wafer 200 is provided. The susceptor 217 is formed of a non-metal material, for example, aluminum nitride (AlN), ceramics, and quartz, and configured such that metal contamination to a film, etc. formed on the wafer 200 can be decreased.

A heater 217b as a heating unit is integrally buried inside the susceptor 217. The heater 217b is configured such that it can heat the surface of the wafer 200, for example, to about 25° C. (degrees Celsius) to 700° C. when electric power is supplied.

The susceptor 217 is electrically insulated from the lower vessel 211. An impedance control electrode 217c is installed inside the susceptor 217. The impedance control electrode 217c is grounded to the earth by way of a variable impedance mechanism 274 as an impedance control unit. The impedance control electrode 217c functions as a second electrode to a cylindrical electrode 215 as a first electrode to be described later. The variable impedance mechanism 274 comprises a coil and a variable capacitor and is configured such that the potential of the wafer 200 (bias voltage) can be controlled by way of the impedance control electrode 217c and the susceptor 217 by controlling the value for the inductance and the resistance of the coil and the capacitance value of the variable capacitor.

The susceptor 217 is provided with a susceptor lifting mechanism 268 for lifting the susceptor 217. Through holes 217a vertically passing through the susceptor 217 are formed in the susceptor 217. On the other hand, wafer projection pins 266 are provided as the first substrate support unit to the bottom of the lower vessel 211. The through holes 217a and the wafer projection pins 266 are provided each at least on three locations at the position opposing to each other. As shown in FIG. 1, when the susceptor 217 is lowered by the susceptor lifting mechanism 268, the wafer 200 loaded in the process chamber 201 is temporarily supported on the wafer projection pins 266 since the wafer projection pins 266 pass through the through holes 217a not in contact with the susceptor 217. Further, as shown in FIG. 2, when the susceptor 217 is lifted by the susceptor lifting mechanism 268, the wafer 200 is transferred from the wafer projection pins 266 to the susceptor 217.

(Lamp Heating Unit)

A light permeable window 278 is provided above the process chamber 201, that is, at the upper surface of the upper vessel 210. A lamp heating unit 280 as a lamp heating device is installed to the outside of a process vessel 203 over the light permeable window 278. The lamp heating unit 280 is provided at a position opposing the susceptor 217 and configured so as to heat the wafer 200 from above the wafer 200. The wafer 200 can be heated by lighting up the lamp heating unit 280 in a shorter time than that by the heater 217b. Further, by the combined use of the lamp heating unit 280 and the heater 217b, the temperature at the surface of the substrate can be increased, for example, to 900° C.

(Gas Supply Unit)

A gas supply pipe 232 and a shower head 236 are provided above the process chamber 201, that is, in the upper portion of the upper vessel 210. The shower head 236 comprises a cap-shaped cover 233, a gas introduction port 234, a buffer chamber 237, an opening 238, a shield plate 240, and a gas blowing port 239 and is configured such that various types of gases can be supplied to the process chamber 201. The buffer chamber 237 is formed as a dispersion space for dispersing a gas introduced from the gas introduction port 234.

A hydrogen-containing gas supply pipe 232a for supplying a hydrogen ($H_2$) gas as a hydrogen-containing gas, a nitrogen-containing gas supply pipe 232b for supplying an nitrogen ($N_2$) gas as a nitrogen-containing gas, an oxygen-containing gas supply pipe 232c for supplying an oxygen ($O_2$) gas as an oxygen-containing gas, and an argon gas supply pipe 232d for supplying an argon (Ar) gas as an inert gas are joined at their respective downstream ends and connected to the gas supply pipe 232.

A $H_2$ gas supply source 250a, a mass flow controller 252a as a flow rate control device, and a valve 253a as an on-off valve are provided in this order from the upstream to the hydrogen-containing gas supply pipe 232a. An $N_2$ gas supply source 250b, a mass flow controller 252b as a flow rate control device, and a valve 253b as an on-off valve are provided in this order from the upstream to the nitrogen-containing gas supply pipe 232b. An $O_2$ gas supply source 250c, a mass flow controller 252c as a flow rate control device, and a valve 253c as an on-off valve are provided in this order from the upstream to the oxygen-containing gas supply pipe 232c. An Ar gas supply source 250d, a mass flow controller 252d as a flow rate control device, and a valve 253d as an on-off valve are provided in this order from the upstream to the argon gas supply pipe 232d.

A valve 254 is provided at the downstream of the hydrogen-containing gas supply pipe 232a, the nitrogen-containing gas supply pipe 232b, the oxygen-containing gas supply pipe 232c, and the argon gas supply pipe 232d where they are joined, and the valve is connected by way of a gasket 203b to the upstream end of a gas introduction port 234. By opening the valves 253a, 253b, 253c, 253d, and 254, the hydrogen-containing gas, the nitrogen-containing gas, the oxygen-containing gas, and the inert gas can be supplied each alone or in combination into the process chamber 201 by way of the gas supply pipes 232a, 232b, 232c, and 232d while controlling the flow rate of each of the gases by the mass flow controllers 252a, 252b, 252c, and 252d.

As the inert gas, a rare gas such as a helium (He) gas, a neon (Ne) gas, a krypton (Kr) gas, etc. may also be used in addition to the argon gas as the inert gas.

A gas supply unit according to this embodiment mainly comprises the shower head 236 (including the cover 233, the gas introduction port 234, the buffer chamber 237, the opening 238, the shield plate 240, the gas blowing port 239), the hydrogen-containing gas supply pipe 232a, the nitrogen-containing gas supply pipe 232b, the oxygen-containing gas supply pipe 232c, the argon gas supply pipe 232d, the $H_2$ gas supply source 250a, the $N_2$ gas supply source 250b, the $O_2$ gas supply source 250c, the Ar gas supply source 250d, the mass flow controllers 252a, 252b, 252c, and 252d, and the valves 253a, 253b, 253c, 253d, and 254.

(Gas Exhaustion Unit)

Figure 3:
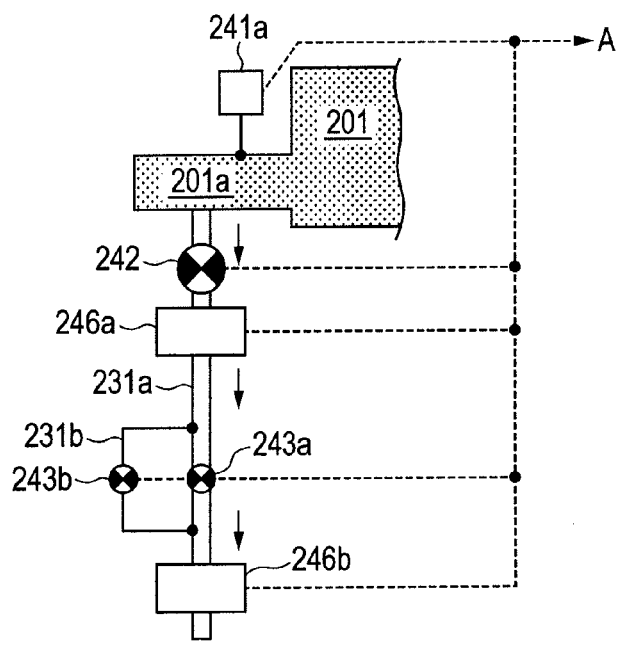
FIG. 3 is a schematic view showing a gas exhaustion unit provided to the substrate processing apparatus according to the first embodiment of the invention.

A gas exhaust chamber 201a is provided to the side wall of the lower vessel 211 for exhausting the gas from the inside of the process chamber 201. The upper stream end of a gas exhaustion pipe 231a is connected to the gas exhaust chamber 201a. As shown in FIG. 3, a diaphragm gauge 241a as a pressure control sensor, for example, a capacitance manometer is provided to the gas exhaust chamber 201a. The diaphragm gauge 241a can measure the pressure, for example, up to 2 Torr (266 Pa) as an upper limit. An APC (Auto Pressure Controller) 242 as a pressure controller (pressure control unit), a turbo molecular pump 246a as an evacuation device, a main valve 243a as an on-off valve, and a dry pump 246b as an evacuation device are provided in this order from the upstream to the gas exhaustion pipe 231a.

The APC 242 is an on-off valve capable of evacuation and stopping of evacuation by opening and closing the valve and, further, capable of controlling the pressure in the process chamber 201 by controlling the opening degree of the valve based on the pressure information measured by the diaphragm gauge 241a. The substrate surface processing using the MMT apparatus 100 is performed under a pressure, for example, of 266 Pa or less and, more preferably, 240 Pa or lower. By setting the pressure for the upper limit of the diaphragm gauge 241a, for example, to 2 Torr (266 Pa), the measuring accuracy in a pressure region of the substrate surface processing can be improved to obtain high pressure controllability and resolution power upon substrate surface processing.

For the turbo molecular pump 246a, a wide band type pump may be used, for example, and, in this case, it is configured to cope with the maximum pressure of 400 Pa on the upstream side of the turbo molecular pump 246a, that is, on the primary side of the turbo molecular pump 246a.

A gas exhaustion pipe 231b that functions also as a slow exhaustion line is provided to the downstream of the turbo molecular pump 246a, that is, on the secondary side of the turbo molecular pump 246a. Specifically, the upstream end of the gas exhaustion pipe 231b is connected between the turbo molecular pump 246a and the main valve 243a of the gas exhaustion pipe 231a. Further, the downstream end of the gas exhaustion pipe 231b is connected between the main valve 243a and the dry pump 246b of the gas exhaustion pipe 231a. For the gas exhaustion pipe 231b, a pipeline, for example, of ⅜ inch is used and a slow exhaust valve 243b as an on-off valve is provided.

The gas exhaustion unit according to this embodiment mainly comprises the gas exhaust chamber 201a, the diaphragm gauge 241a, the gas exhaustion pipe 231a, the APC 242, the turbo molecular pump 246a, the main valve 243a, the dry pump 246b, and the gas exhaustion pipe 231b, and the slow exhaust valve 243b.

(Plasma Generation Unit)

To the outer periphery of the process chamber 201, that is, to the outside of the side wall of the upper vessel 210, a cylindrical electrode 215 as the first electrode is provided so as to surround the process chamber 201. The cylindrical electrode 215 is formed in a cylindrical shape, for example, a circular cylindrical shape. The cylindrical electrode 215 is connected to a high frequency power source 273 at a frequency, for example, of 13.56 MHz for applying a high frequency power by way of a matching device 272 for impedance matching.

An upper magnet 216a and a lower magnet 216b are attached respectively to the upper and lower ends at the outer surface of the cylindrical electrode 215. Both of the upper magnet 216a and lower magnet 216b comprise each permanent magnets each formed into a cylindrical shape, for example, a circular cylindrical shape. Each of the upper magnet 216a and the lower magnet 216b has a magnetic pole on the side of the surface facing the process chamber 201 and on the side of the surface opposite thereto.

The upper magnet 216a and the lower magnet 216b are arranged such that the direction of the magnetic poles are opposed to each other. That is, magnetic poles of the upper magnet 216a and the lower magnet 216b on the side of the surface facing the process chamber 201 have polarities different from each other. Thus, a line of magnetic force in the axial direction of the cylinder is formed along the inner surface of the cylindrical electrode 215.

The plasma generation unit is configured such that after magnetic fields are generated by the upper magnet 216a and the lower magnet 216b and after introducing various types of gases in the process chamber 201, a high frequency power is supplied to the cylindrical electrode 215 to form electric fields, thereby generating magnetron discharge plasmas to the plasma generation region 224 in the process chamber 201 as shown in FIG. 2. Since the electromagnetic fields cause the emitted electrons to conduct circular motion, ionization and generation ratio of plasmas can be increased to generate long lasting and high density plasmas.

At the periphery of the cylindrical electrode 215, the upper magnet 216a, and the lower magnet 216b, a metal shielding plate 223 is provided for effectively shielding electromagnetic fields such that the electromagnetic fields generated thereby give no undesired effects on other devices or external circumstances.

The plasma generation unit according to this embodiment mainly comprises the cylindrical electrode 215, the matching device 272, the high frequency power source 273, and the upper magnet 216a and the lower magnet 216b.

(Substrate Transporting Port)

Further, a not illustrated substrate transporting chamber port is formed to the outside of the process vessel 203 by way of the gate valve 244. The substrate transporting chamber port is in communication with a not illustrated substrate transport chamber connected to the MMT apparatus 100. A not illustrated transporting mechanism is provided to the substrate transporting chamber and configured such that the substrate can be loaded into and unloaded from the inside of the process chamber 201. The temperature in the substrate transporting chamber is kept, for example, at a room temperature and the pressure is kept at 0.1 Pa or higher and 266 Pa or lower, for example, at about 100 Pa. Thus, even when particles are generated in the substrate transporting chamber, scattering of the particles by the loading or unloading operation of the substrate by the transporting mechanism can be suppressed.

(Control Unit)

The control unit (controller) 121 controls the diaphragm gauge 241a, the APC 242, the turbo molecular pump 246a, dry pump 246b, the main valve 243a, and the slow exhaust valve 243b by way of a signal line A, the susceptor lifting mechanism 268 by way of a signal line B, the heater 217b and the variable impedance mechanism 274 by way of a signal line C, the gate valve 244 by way of an signal line D, the matching device 272 and the high frequency power source 273 by way of a signal line E, the mass flow controllers 252a, 252b, and the valves 253a, 253b, and 254 by way of a signal line F, and the lamp heating unit 280 by way of a signal line G, respectively.

(2) Substrate Processing Step

Then, a substrate processing step according to the first embodiment is to be described. The substrate processing step according to the first embodiment is performed as one of the manufacturing steps of the semiconductor device, for example, by the MMT apparatus 100. In the substrate processing step according to the first embodiment, the temperature of the wafer 200 is elevated on the side of the susceptor 217 by the heater 217b as a heating unit incorporated in the susceptor 217 as a second substrate support unit. Further, while heating the wafer 200, a predetermined substrate surface processing, for example, nitridation is applied to the wafer 200 formed, for example, of silicon (Si). In the following description, the operation of each of the units forming the MMT apparatus 100 is controlled by the controller 121.

(Substrate Loading Step)

At first, the pressure in the process chamber 201 is set to a pressure, for example, of 100 Pa identical with that in the substrate transporting chamber (not illustrated) which is adjacent with the process chamber 201, and the wafer 200 is loaded from the substrate transporting chamber to the process chamber 201. Specifically, the inside of the process chamber 201 is evacuated by using the turbo molecular pump 246a and the dry pump 246b and, a gas, for example an inert gas, giving no undesired effects on the wafer 200 or the substrate surface processing applied to the wafer 200 is supplied to the process chamber 201 to control the pressure inside the process chamber 201 to a pressure about identical with that in the substrate transporting chamber.

Then, the susceptor 217 is lowered as far as the transporting position of the wafer 200 and the wafer projection pins 266 are passed through the through holes 217a of the susceptor 217. As a result, the wafer projection pins 266 are put to a state of protruding from the upper surface of the susceptor 217 by a predetermined height, for example, about from 0.5 mm to 3.0 mm.

Successively, the gate valve 244 is opened and the wafer 200 is loaded from the substrate transporting chamber into the process chamber 201 by using a transporting mechanism not illustrated in the drawing. As a result, the wafer 200 is supported in a horizontal state on the wafer projection pin 266 protruding from the upper surface of the susceptor 217. After loading the wafer 200 into the process chamber 201, the transporting mechanism is retracted to the outside of the process chamber 201 and the gate valve 244 is closed to tightly seal the inside of the process chamber 201.

An electric power is supplied previously to the heater 217b, and the heater 217b and the susceptor 217 are heated to a predetermined temperature within a range, for example, of 25° C. or higher and 700° C. or lower, and 900° C. or lower in a case of using the lamp heating unit 280 together.

Then, if the loaded wafer 200 is directly transferred over the susceptor 217, the contact surface of the wafer 200 with the susceptor 217 is heated more easily to result in the difference of the temperature elevation rate with respect to the surface on the opposite side of the wafer 200. As a result, the temperature uniformity of the wafer 200 may possibly be deteriorated. Deterioration of the temperature uniformity of the wafer 200 tends to occur, for example, at 700° C. or higher.

Then, in this embodiment, the following substrate temperature elevation step is performed before transferring the wafer 200 to the susceptor 217. That is, the present inventors, et al. have thought out as described below to support the wafer 200 while spacing apart from the susceptor 217 by the wafer projection pins 266 and elevate the temperature of the wafer 200 gradually while keeping satisfactory temperature uniformity of the wafer 200 by the heat radiation from the susceptor 217. However, there may be a possibility in such a method to take a long time for elevating the temperature of the wafer 200 to a predetermined temperature.

Accordingly, the present inventors made further studies for rapidly elevating the temperature of the wafer 200. Description is to be made to a method of rapidly elevating the temperature of the wafer 200 while improving the temperature uniformity of the wafer 200 based on the findings obtained by the present inventors, et al. from the results of the studies.

(Substrate Temperature Elevation Step)

In the substrate temperature elevation step, the temperature of the wafer 200 loaded into the process chamber 201 is elevated. Specifically, the wafer 200 is supported being spaced apart from the susceptor 217 by the wafer projection pins 266 above the susceptor 217 heated to a predetermined temperature within a range, for example, of 25° C. or higher and 700° C. or lower by the heater 217b (900° C. or lower in a case of using the lamp heating unit 280 together). The temperature of the susceptor 217 in the substrate temperature elevation step is maintained at least till the end of the plasma processing step to be described later.

For example, an $N_2$ gas as a pressure elevation gas is supplied to the process chamber 201 to increase the pressure in the process chamber 201, while exhausting the gas inside of the process chamber 201 by the turbo molecular pump 246a and the dry pump 246b by way of the gas exhaustion pipe 231a. Specifically, the $N_2$ gas is supplied by way of the buffer chamber 237 to the process chamber 201 by opening the valves 253b and 254 while controlling the flow rate by the mass flow controller 252b. In this step, the flow rate of the $N_2$ gas is set to a predetermined value within a range, for example, of 1000 sccm or more and 2000 sccm or less. Thus, the pressure in the process chamber 201 is controlled to a predetermined value higher than the pressure in the substrate loading step within a range, for example, of 100 Pa or more and 266 Pa or less. The turbo molecular pump 246a and the dry pump 246b are kept operated at least to the completion of the substrate unloading step to be described later.

The temperature of the wafer 200 is gradually elevated from the surface on the side of the susceptor 217 by the radiation of heat from the susceptor 217 by keeping the state described above for a predetermined time, for example, from 40 sec to 60 sec. In this case, since the wafer 200 is supported being spaced apart from the susceptor 217, abrupt temperature elevation at the surface on the side of the susceptor 217 of the wafer 200 can be suppressed to decrease the difference of the temperature elevation rate between the surface on the side of the susceptor 217 (hereinafter also referred to as a lower surface) and the surface on the opposite side (hereinafter also referred to as the upper surface) of the wafer 200 and improve the temperature uniformity of the wafer 200.

Further, as described above, the inside of the process chamber 201 is filled with the $N_2$ gas. Thus, heat is conducted from the susceptor 217 to the wafer 200 by the $N_2$ gas present between the susceptor 217 and the wafer 200. That is, since the wafer 200 is heated also by the heat conduction of the $N_2$ gas in addition to the radiation of heat from the susceptor 217, the temperature elevation rate of the wafer 200 can be improved.

Further, the distance between the wafer 200 and the susceptor 217 is preferably controlled depending on the difference of the temperature of the wafer 200 (for example, normal temperature) and the temperature of the susceptor 217 (temperature heated to a predetermined level by the heater 217b) upon loading. That is, when the difference between the temperature of the wafer 200 and the temperature of the susceptor 217 is large, the distance between the wafer 200 and the susceptor 217 is made larger thereby suppressing the generation of the difference in the temperature elevation rate relative to the upper surface of the wafer 200 due to abrupt temperature elevation of the lower surface of the 200. Further, when the difference between the temperature of the wafer 200 and the temperature of the susceptor 217 is small, the distance between the wafer 200 and the susceptor 217 is made smaller thereby capable of accelerating the temperature elevation of the wafer 200 to shorten the time till the wafer 200 reaches a predetermined temperature. The distance between the wafer 200 and the susceptor 217 can be controlled, for example, by the lifting of the susceptor 217 by a susceptor lifting mechanism 268.

Further, the distance between the wafer 200 and the susceptor 217 is preferably controlled not only by the temperature difference between the wafer 200 and the susceptor 217 but also according to the type of the gas supplied to the process chamber 201 ($N_2$ gas in this embodiment), the gas flow rate, the pressure in the process chamber 201, etc. This can suppress abrupt temperature elevation of the lower surface of the wafer 200, or accelerate the temperature elevation of the wafer 200.

(Substrate Transferring Step)

After lapse of a predetermined time, the wafer 200 heated to a predetermined temperature is transferred from the wafer projection pins 266 to the susceptor 217. That is, the susceptor 217 is lifted by using the susceptor lifting mechanism 268 and the wafer is supported on the upper surface of the susceptor 217. Then, the wafer 200 is lifted to a predetermined processing position.

(Processing Gas Supplying Step)

Then, an $N_2$ gas is supplied as a processing gas to the process chamber 201. In this embodiment, since the $N_2$ gas used, for example, as the pressure elevation gas is used also as the processing gas for processing the surface of the substrate, the $N_2$ gas can be supplied by keeping the supply of the $N_2$ gas to the process chamber 201 continuously which has been started in the substrate temperature elevation step described above. In this state, the flow rate of the $N_2$ gas as the processing gas and the pressure in the process chamber 201 are set to predetermined values for substrate processing by the control of the mass flow controller 252b and the APC 242 again. That is, the flow rate of the $N_2$ gas is controlled to a predetermined value within a range, for example, of 100 sccm or more and 500 sccm or less. Further, the gas inside of the process chamber 201 is exhausted by controlling the opening degree of the APC 242 such that the pressure in the process chamber 201 is at a predetermined pressure within a range, for example, of 1 Pa or more and 266 Pa or less. As described above, supply of the $N_2$ gas is further continued till the completion of the plasma processing step to be described later while properly exhausting gas the inside of the process chamber 201.

(Plasma Processing Step)

When the pressure in the process chamber 201 is settled, application of a high frequency power at a predetermined output value within a range, for example, of 150 W or higher and 1000 W or lower is started to the cylindrical electrode 215 from the high frequency power source 273 by way of the matching device 272. In this step, the variable impedance mechanism 274 is previously controlled to a predetermined impedance value. Thus, plasma discharge is caused in the process chamber 201, more specifically, in the plasma generation region 224 above the wafer 200 to excite the $N_2$ gas. The $N_2$ gas is, for example, ionized and dissociated into plasmas to generate reaction species such as active nitrogen species including nitrogen (N). Nitridation is applied to the surface of the wafer 200 by the active nitrogen species formed by the excitation of the $N_2$ gas.

As described above, the temperature of the susceptor 217 in the step of elevating the temperature of the substrate is maintained also in the plasma processing step to heat the wafer 200. The plasma processing step is a step of processing surface of the substrate of heating and processing the substrate.

Subsequently, after lapse of a predetermined processing time, application of the power from the high frequency power source 273 is interrupted to stop the plasma discharge in the process chamber 201. Further, the valves 253b and 254 are closed to stop the supply of the $N_2$ gas to the process chamber 201. With the procedures described above, the plasma processing step is completed.

(Exhausting Step)

When the supply of the $N_2$ gas is stopped, the gas inside of the process chamber 201 is exhausted by using the gas exhaustion pipe 231a. Thus, the $N_2$ gas and the gas such as the active nitrogen species in the process chamber 201 are exhausted to the outside of the process chamber 201. Then, the valves 253b and 254 are opened and the $N_2$ gas is supplied to the process chamber 201 while controlling the flow rate by the mass flow controller 252b. Further, the opening degree of the APC 242 is controlled thereby controlling the pressure in the process chamber 201 to a pressure (for example 100 Pa) identical with the pressure in the substrate transport chamber (not illustrated, to which the wafer 200 is unloaded) adjacent to the process chamber 201.

(Substrate Unloading Step)

When the pressure in the process chamber 201 reaches a predetermined level, the susceptor 217 is lowered to the transporting position of the wafer 200 and the wafer 200 is supported on the wafer projection pins 266. Then, the gate valve 244 is opened and the wafer 200 is unloaded to the outside of the process chamber 201 by using the transporting mechanism not illustrated in the drawing. With the procedures described above, the substrate processing step according to this embodiment is completed.

When the $N_2$ gas is supplied to increase the pressure in the process chamber 201 in the step of elevating the temperature of the substrate described above, the $N_2$ gas may be sealed in the process chamber 201 while putting the inside of the process chamber 201 in a tightly closed state. That is the pressure in the process chamber 201 may also be increased by stopping exhaustion from the inside of the process chamber 201 by closing the APC 242 while supplying the $N_2$ gas into the process chamber 201. Thus, the pressure elevation rate in the process chamber 201 can be increased and the temperature elevation rate of the wafer 200 can be increased. Further, the pressure control time from the step of elevating the temperature of the substrate to the step of processing the substrate surface (plasma processing step) can be shortened by defining the upper limit of the pressure to 266 Pa so that the pressure in the substrate temperature elevation step does not greatly deviate from the pressure during substrate surface processing.

Further, when the $N_2$ gas is supplied to the process chamber 201 in the substrate temperature elevation step, the position for supplying the $N_2$ gas, etc. may be different from the position described above. For example, a nozzle is provided to the side wall of the lower vessel 211 installed to the process furnace 202, and the $N_2$ gas, etc. are supplied by way of the nozzle near the transporting position of the wafer 200 when the susceptor 217 is lowered, more specifically, at a position between the wafer 200 supported on the wafer projection pins 266 and the susceptor 217. Thus, a portion of the $N_2$ gas that receives the heat from the susceptor 217 on the side of the lower surface of the wafer 200 goes around to the upper surface of the wafer 200 to promote heat conduction to the side of the upper surface. As described above, the temperature elevation rate of the wafer 200 can be increased also by the convection of the $N_2$ gas, etc.

(3) Effect According to the First Embodiment

The first embodiment provides one or plural effects shown below.

(a) The first embodiment has a substrate temperature elevation step of elevating the temperature of the wafer 200 loaded in the process chamber 201. That is, in the substrate temperature elevation step, the wafer 200 loaded into the process chamber 201 is supported above the susceptor 217 installed in the process chamber 201 being spaced apart from the susceptor 217 by the wafer projection pins 226, and the temperature of the wafer 200 is elevated by the heater 217b by way of the susceptor 217. Thus, difference in the temperature elevation rate is decreased between the surface of the wafer 200 on the side of the susceptor 217 (lower surface) and the surface on the opposite side (upper surface) and the temperature uniformity of the wafer 200 can be improved.

(b) Further, according to the first embodiment, in the substrate temperature elevation step, the temperature of the wafer 200 is elevated in a state of supplying the $N_2$ gas by the gas supply unit to the inside of the process chamber 201 and increasing the pressure in the process chamber 200 to higher than the pressure in the substrate loading step. Or, in the substrate temperature elevation step, the temperature of the wafer 200 is elevated in a state of increasing the pressure in the process chamber 200 to higher than the pressure in the plasma processing step. Thus, heat is conducted from the susceptor 217 to the wafer 200 also by the $N_2$ gas present between the susceptor 217 and the wafer 200 in addition to the heat radiation from the susceptor 217 and the temperature of the wafer 200 can be elevated rapidly by improving the temperature elevation rate of the wafer 200.

(c) The configuration of temporarily supporting the wafer 200 while being spaced apart from the susceptor 217 in the first embodiment can be applied by merely changing the timing for a portion of the sequence of loading the wafer 200 into the process chamber 201 and positioning the wafer to the processing position. This scarcely gives undesired effects on the subsequent plasma processing step.

(d) Further, the first embodiment can control the distance between the wafer 200 supported on the wafer projection pins 266 and the susceptor 217 also depending on the difference between the temperature of the wafer 200 and the temperature of the susceptor 217 (temperature heated to a predetermined temperature by the heater 217*b*) during loading of the wafer. Thus, when the temperature difference between both of them is large, the difference of the temperature elevation rate between the lower surface and the upper surface of the wafer 200 can be decreased by making the distance larger. Further, the time required for temperature elevation of the wafer 200 can be shortened when the temperature difference is small by making the distance smaller.

(e) Further, the first embodiment can control the distance between the wafer supported on the wafer projection pins 266 and the susceptor 217 also depending on the kind of the gas supplied to the process chamber 201, the gas flow rate, the pressure in the process chamber 201, etc. in the substrate temperature elevation step. This can suppress abrupt temperature elevation at the lower surface of the wafer 200 or shorten the temperature elevation time for the wafer 200.

(f) Further, when the $N_2$ gas is supplied in the substrate temperature elevation step, the first embodiment can supply the $N_2$ gas, etc. by way of the nozzle also between the wafer supported on the wafer projection pins 266 and the susceptor 217. Then, a portion of the $N_2$ gas on the side of the lower surface of the wafer 200 that receives heat from the susceptor 217 goes around to the upper surface of the wafer 200 to promote heat conduction and improve the temperature elevation rate of the wafer 200 thereby capable of shortening the temperature elevation time.

(g) Further, according to the first embodiment, the temperature uniformity of the wafer 200 can be improved. Accordingly, the effect of reducing the warp of the wafer 200 caused by the difference of the thermal expansion between the upper and the lower surfaces of the wafer 200 can also be expected. The warp of the wafer 200 tends to occur, for example, when the temperature of the wafer 200 increases to 700° C. or higher.

Second Embodiment

For the first embodiment, description has been made to a case of elevating the temperature of the wafer 200 by the heat radiation from the susceptor 217 and the heat conduction of the N 2 gas in a state where the wafer 200 is supported being spaced apart from the susceptor 217 by the wafer projection pins 266, and the inside of the process chamber 201 is filled with the $N_2$ gas to increase the pressure. In such an embodiment, it is considered that as the pressure in the process chamber 201 increases, the temperature elevation rate by heat conduction is improved more. However, in the MMT apparatus 100 according to the embodiment, the upper limit of the pressure of the diaphragm gauge 241*a* adjusted to the pressure region upon substrate surface processing (for example, plasma processing) was the upper limit value (for example 266 Pa) for the usable pressure.

Then in the second embodiment of the invention, description is to be made to an MMT apparatus and a substrate processing step using the MMT apparatus capable of performing a substrate temperature elevation step in a further high pressure region so as to further shorten the time required for the temperature elevation of the wafer 200 without lowering the measurement accuracy for the pressure region in the substrate surface processing.

(1) Configuration of Substrate Processing Apparatus

Figure 4:
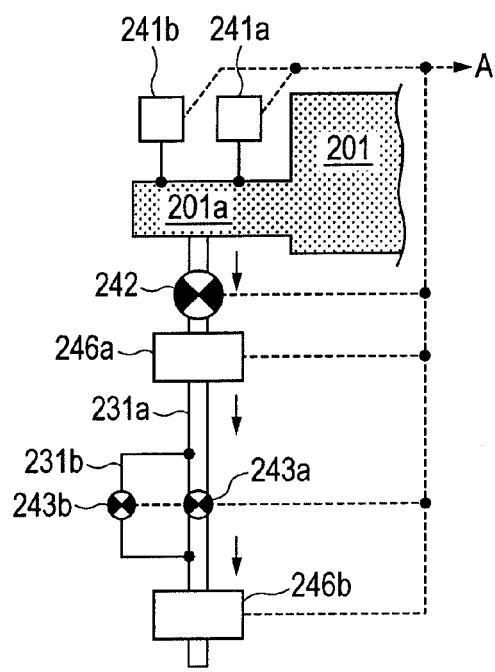
FIG. 4 is a schematic view showing an example of a gas exhaustion unit provided to a substrate processing apparatus according to a second embodiment of the invention.
Figure 5:
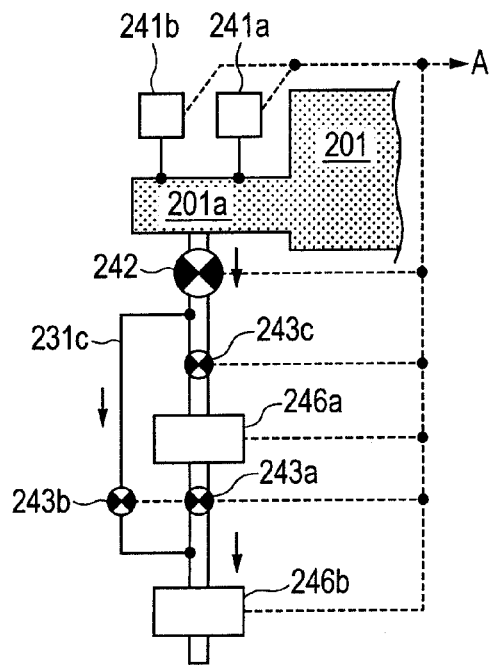
FIG. 5 is a schematic view showing another example of a gas exhaustion unit provided to the substrate processing apparatus according to the second embodiment of the invention.

The MMT apparatus according to the second embodiment is different from the first embodiment in view of the configuration of the gas exhaustion unit. Since other configurations are identical with those of the MMT apparatus 100 shown in FIG. 1, description therefor is omitted and the configuration of the gas exhaustion unit is to be described with reference to FIG. 4 and FIG. 5. FIG. 4 is a schematic view showing an example of a gas exhaustion unit provided to an MMT apparatus according to the second embodiment and FIG. 5 is a schematic view showing another example of a gas exhaustion unit provided to the MMT apparatus according to the second embodiment. In FIG. 4 and FIG. 5, components identical with those of FIG. 3 for the first embodiment carry the same reference numerals for which description is to be omitted.

In a gas exhaust chamber 201*a* of a gas exhaustion unit shown in FIG. 4, a diaphragm gauge 241*b* as a pressure control sensor such as, for example, a capacitance manometer is provided in addition to a diaphragm gauge 241*a*. The diaphragm gauge 241*b* is configured such that it can measure, for example, up to 10 Torr (1330 Pa) as the upper limit pressure. Thus, the pressure in the process chamber 201 can be increased, for example, to about 400 Pa as the maximum pressure that can be coped with by the turbo molecular pump 246*a* by adjusting the valve opening degree of the APC 242 based on the pressure information measured in the diaphragm gauge 241*b*.

Also in the gas exhaustion unit in FIG. 5, a diaphragm gauge 241*b* is provided to the gas exhaust chamber 201*a*. Further, in the gas exhaustion unit shown in FIG. 5, a slow exhaustion line has a structure of by passing the turbo molecular pump 246*a*. That is, a shut-off valve 243*c* is provided as an on-off valve between an APC 242 and the turbo molecular pump 246*a* in the gas exhaustion pipe 231*a* connected at the upstream end to the gas exhaust chamber 201*a*. The upstream end of the gas exhaustion pipe 231*c* of the slow exhaustion line is connected between the APC 242 and the shut-off valve 243*c* of the gas exhaustion pipe 231*a*, and the downstream end of the gas exhaustion pipe 231*c* is connected between the main valve 243*a* and the dry pump 246*b* of the gas exhaustion pipe 231*a*. This configuration can increase the pressure in the process chamber 201, for example, to about 10 Torr (1330 Pa) as the upper limit pressure of the diaphragm gauge 241*b* irrespective of the pressure that can be coped with by the turbo molecular pump 246*a*. That is, by controlling the valve opening degree of the APC 242 based on the pressure information measured by the diaphragm gauge 241*b* in a state of closing the shut-off valve 243*c* and opening the slow exhaust valve 243*b*, pressure in the process chamber 201 can be controlled to a high pressure without exposing the turbo molecular pump 246*a* to a high pressure. Since the gas exhaustion pipe 231*c* of the slow exhaustion line has an exhaustion conductance, for example, comparable with that of a ⅜ inch pipeline, it can cope with even a high pressure of 400 Pa or higher.

(2) Substrate Processing Step

The substrate processing step according to the second embodiment is performed by the MMT apparatus having the gas exhaustion unit shown in FIG. 4 or FIG. 5 as a manufacturing step of the semiconductor device. Also in the substrate processing step according to the second embodiment, while nitridation by the $N_2$ gas is performed in the same manner as in the first embodiment, the substrate processing step according to the second embodiment is different from the first embodiment mainly for the substrate temperature elevation step. The difference is to be described below. In the following description, it is assumed that the MMT apparatus has the gas exhaustion unit of FIG. 5. Further, operation of each of the units constituting the MMT apparatus according to the second embodiment is controlled by the controller identical with the controller 121 in FIG. 1.

(Substrate Temperature Elevation Step)

A temperature elevation step is performed to the wafer 200 loaded into the process chamber 201 in the substrate loading step. That is, in the same procedures as in the first embodiment, the wafer 200 is supported over the susceptor 217 heated to a predetermined temperature by the heater 217*b* within a range, for example, of 25° C. or higher and 700° C. or lower (900° C. or lower in a case of using the lamp heating unit 280 together) while being spaced apart from the susceptor 217. For example, an $N_2$ gas as the pressure elevation gas is supplied in the process chamber 201 to increase the pressure in the process chamber 201 to higher than the pressure, for example, in the substrate loading step. Specifically, the $N_2$ gas is supplied by way of the buffer chamber 237 into the process chamber 201 by opening the valves 253*b* and 254 while controlling the flow rate by the mass flow controller 252*b*. In this step, the flow rate of the $N_2$ gas is controlled to a predetermined value within a range, for example, of 1000 sccm or more and 2000 sccm or less. Further, the pressure in the process chamber 201 is controlled to a predetermined pressure within a range, for example, of 240 Pa or higher and 1000 Pa or lower, more preferably, 400 Pa or higher and 1000 Pa or lower. Specifically, the opening degree of the APC 242 is controlled based on the pressure information measured by the diaphragm gauge 241*b* in a state of closing the shut-off valve 243*c* and opening the slow exhaust valve 243*b* to exhaust the inside of the process chamber 201.

Thus, the inside of the process chamber 201 is filled with the $N_2$ gas. By keeping the state for a predetermined time, for example, of 40 sec to 60 sec, heat is conducted from the susceptor 217 to the wafer 200 by the $N_2$ gas present between the susceptor 217 and the wafer 200. That is, since the wafer 200 is heated also by heat conduction of the $N_2$ gas in addition to the heat radiation from the susceptor 217, the temperature elevation rate of the wafer 200 can be improved.

Further, the distance between the wafer 200 supported on the wafer projection pins 266 and the susceptor 217 can be controlled depending, for example, on the temperature difference between the wafer 200 and the susceptor 217 upon loading of the substrate, the type of the gas ($N_2$ gas in this embodiment), the flow rate of the gas supplied in the process chamber 201, the gas flow rate, the pressure in the process chamber 201, etc. Thus, the abrupt temperature elevation at the lower surface of the wafer 200 can be suppressed or the temperature elevation of the wafer 200 can be accelerated.

(Substrate Transferring Step)

After lapse of a predetermined time, the wafer 200 is transferred onto the susceptor 217 and lifted to a predetermined processing position by the same procedures as in the substrate transfer step according to the first embodiment.

(Processing Gas Supplying Step)

In the second embodiment, supply of the $N_2$ gas to the process chamber 201 started, for example, in the substrate temperature elevation step is continued. In this state, the flow rate of the $N_2$ gas as the processing gas and the pressure in the process chamber 201 in the substrate surface processing are controlled to predetermined values in the same manner, for example, as in the processing gas supplying step according to the first embodiment by re-adjustment of the mass flow control 252*b* and the APC 242.

Pressure control by the APC 242 is performed based on the pressure information measured by the diaphragm gauge 241*a*. Thus, the pressure upon substrate surface processing (for example, plasma processing) performed under a pressure, for example, of 266 Pa or lower, more preferably, 240 Pa or lower can be controlled accurately. As described above, the pressure in the process chamber 201 can be measured and controlled at a good accuracy by using the respective diaphragms gauges 241*a* and 241*b* selectively according to the control pressure in each of the steps (substrate temperature elevation step and substrate surface processing step).

Further, when controlling the pressure in the process chamber 201 to a predetermined value, exhaustion of the gas in the process chamber 201 is continued by way of the gas exhaustion pipe 231*c* as the slow exhaustion line in a state of closing the shut-off valve 243*c* and opening the slow exhaust valve 243*b* so that the turbo molecular pump 246*a* is not exposed to a high pressure till the pressure in the process chamber 201 is lowered, for example, to about 400 Pa. After the pressure in the process chamber 201 is lowered to 400 Pa or lower, the gas inside of the process chamber 201 is exhausted by way of the turbo molecular pump 246*a* by closing the slow exhaust valve 243*b* and opening the shut-off valve 243*c*.

The substrate processing step by the MMT apparatus provided with the gas exhaustion unit in FIG. 5 has been explained as described above.

The method of using the nozzle provided on the side wall of the lower vessel 211 for the supply of the $N_2$ gas, etc. or the method of increasing the pressure in the process chamber 201 by sealing the $N_2$ gas in the process chamber 201 in the substrate temperature elevation step described for the first embodiment can be applied also in the second embodiment. In a case of sealing the $N_2$ gas, the upper limit pressure can be increased as far as 1000 Pa in the second embodiment.

Further, when the MMT apparatus has the gas exhaustion unit shown in FIG. 4, the pressure in the process chamber 201 in the temperature elevation step can be controlled, for example, to 1 Pa or higher and 400 Pa or lower with the pressure that can be coped with by the turbo molecular pump 246*a* being as the upper limit.

(3) Effect According to the Second Embodiment

Also the second embodiment provides the same effects as in the first embodiment.

(a) Further, according to the second embodiment, the pressure in the process chamber 200 is increased to 240 Pa or higher and 1,000 Pa or lower, preferably, 400 Pa or higher and 1,000 Pa or lower in the substrate temperature elevation step. This can further promote heat transmission with the $N_2$ gas from the susceptor 217 to the wafer 200 and further improve temperature elevation rate of the wafer 200 to shorten the temperature elevation time.

(b) Further, according to the second embodiment, the gas exhaustion unit comprises the diaphragm gauge 241*a* having the upper limit of 2 Torr (266 Pa) for the measurement of pressure, and the diaphragm gauge 241*b* having the upper limit of 10 Torr (1330 Pa) for the measurement of pressure. Further, in the processing gas supply step, the plasma processing step, etc., pressure in the processing chamber 201 is controlled based on the pressure information of the diaphragm gauge 241a, and the pressure in the process chamber 201 is controlled based on the pressure information of the diaphragm gauge 241b in the substrate temperature elevation step. This can maintain the accuracy for the controlled pressure during the processing gas supplying step or the substrate surface processing step (for example, plasma processing), and increase the pressure in the process chamber 201 in the substrate temperature elevation step to higher than the pressure during the process gas supply or the substrate surface processing.

(c) Further, according to the second embodiment, the gas exhaustion unit comprises a slow exhaustion line of a structure that bypasses the turbo molecular 246a. This can increase the pressure in the process chamber 201 to the upper limit pressure of the diaphragm gauge 241b which is further higher than the pressure that can be coped with by the turbo molecular pump 246a in the substrate temperature elevation step. Accordingly, the temperature of the wafer 200 can be elevated at a higher rate.

Third Embodiment

In the first and the second embodiments, description has been made to a case of elevating the temperature of the wafer 200 by using the heater 217b buried in the susceptor 217 as the heating unit. However, according to such a method, the temperature of the wafer 200 is elevated by heating the wafer mainly on the side of the lower surface of the wafer 200 and it may be considered such a case that the difference of the temperature elevation rate between the lower surface and the upper surface of the wafer 200 cannot be decreased sufficiently.

Further, as the first and second embodiments, when the $N_2$ gas, etc. are blown out of the shower head 236 above the wafer 200 and supplied to the process chamber 201, if the temperature of the supplied $N_2$ gas, etc. is, for example, relatively low, it may be considered a case where the $N_2$ gas etc. directly hit on the upper surface of the wafer 200 to cool the upper surface of the wafer 200 thereby weakening the effect of decreasing the difference of the temperature elevation rate with respect to the lower surface of the wafer 200.

Then, the present inventors have made further studies for enhancing the effect of decreasing the difference of the temperature elevation rate between the upper surface and the lower surface of the wafer 200. A method of further decreasing the difference of the temperature elevation rate between the lower surface and the upper surface of the wafer 200 and further improving the temperature uniformity of the wafer 200 is to be described based on the finding obtained from the result of the study by the present inventors with reference to the third embodiment of the present invention.

(1) Substrate Processing Step

Also in the substrate processing step according to the third embodiment, nitridation with the $N_2$ gas is performed by using the MMT apparatus of the second embodiment having the gas exhaustion unit shown in FIG. 5. Description is to be made mainly for the substrate temperature elevation step different from the second embodiment.

(Substrate Temperature Elevation Step)
In the same procedures as those in the second embodiment, the wafer 200 is supported above the susceptor 217 heated to a predetermined temperature, for example, by the heater 217b within a range of 25° C. or higher and 700° C. or lower (900° C. or lower in a case of using the lamp heating unit 280 together), which being spaced apart from the susceptor 217. Further, a gas giving no undesired effect on the wafer 200 or the substrate surface processing applied to the wafer 200, or an inert gas, for example, an $N_2$ gas, a helium (He) gas, an argon (Ar) gas, a krypton (Kr) gas, a xenon (Xe) gas, etc. is supplied by way of the buffer chamber 237 to the process chamber 201 by opening the valves 253b and 254 and controlling the flow rate by the mass flow controller 252b. Assuming that the $N_2$ gas is used, for example, the flow rate of the $N_2$ gas can be controlled to a predetermined value within a range, for example, of 1000 sccm or higher and 2000 sccm or lower. Further, pressure in the process chamber 201 is controlled to a predetermined pressure within a range, for example, of 240 Pa or higher and 1000 Pa or lower and, more preferably, 400 Pa or higher and 1000 Pa or lower.

Then, when the pressure in the process chamber 201 is settled, application of a high frequency power at a predetermined output value in a range, for example, of 150 W or more and 1000 W or less is started to the cylindrical electrode 215 from the high frequency power source 273 by way of the matching device 272. In this case, the variable impedance mechanism 274 is previously controlled to a predetermined impedance value. Thus, plasma discharge is caused in the process chamber 201, more specifically, in the plasma generation region 224 above the wafer 200.

As described above, by exciting the inert gas, etc. to generate plasmas above the wafer 200, heat from the plasmas is conducted to the wafer 200 and the wafer 200 is heated also on the side of the upper surface. This can elevate the temperature of the wafer 200 by heating the wafer from both surfaces using the heater 217b below the lower surface of the wafer 200 and the plasmas above the upper surface of the wafer 200 as the heat source. Therefore, difference of the temperature elevation rate between the lower surface and the upper surface of the wafer 200 can be decreased further.

Further, upon application of the high frequency power, temperature of the wafer 200 is increased rapidly. Accordingly, the temperature elevation time of the wafer 200 can be shortened further compared with the case of supplying the gas without ionization into plasmas as in the second embodiment.

The wafer 200 is exposed, for example, to atmospheric air before loading into the process chamber 201 and a spontaneous oxide film ($SiO_2$ film) is sometimes formed previously to the surface of the wafer 200. In such a case, an $H_2$ gas as a hydrogen-containing gas may also be introduced instead of the $N_2$ gas into the process chamber 201 and excited in the substrate temperature elevation step. For example, the $H_2$ gas is ionized into plasmas and dissociated to form reaction species such as hydrogen (H) containing active hydrogen species. The spontaneous oxide film at the surface of the wafer 200 can be etched by the thus formed active hydrogen species, etc. to remove at least a portion thereof. The etching rate by the $H_2$ gas plasmas for the spontaneous oxide film is increased more as the temperature of the wafer 200 is higher, that is, as the temperature of the heater 217b is previously set higher. Further, the etching rate is increased also by increasing the high frequency power applied to the cylindrical electrode 215. As described above, by previously removing the spontaneous oxide film on the surface of the wafer 200, the nitridation rate and the nitridation concentration in the plasma processing step can be improved.

Further, an uneven pattern is sometimes formed on the surface of the wafer 200 and, further, the spontaneous oxide film ($SiO_2$) is sometimes formed substantially over the entire surface. In such a case, the capacitance between the wafer

200 and the impedance control electrode 217c can be decreased by increasing the protruding height of the projection pins 266 in the substrate temperature elevation step. When the capacitance is decreased, the amount of drawing the plasmas can be decreased by lowering the bias potential of the wafer 200. And the oxide removal rate for the bottom of the concave portion and the upper surface of the convex portion relative to the oxide removal rate on the lateral side of the uneven pattern at the surface of the wafer 200 can be suppressed to uniformly remove the spontaneous oxide film formed on the bottom and the upper surface of the uneven pattern and the spontaneous oxide film formed on the lateral side of the uneven pattern. Accordingly, even when the uneven pattern is formed on the surface of the wafer 200, the effect due to the spontaneous oxide film can be decreased and the nitridation rate and the nitridation concentration in the plasma processing step can be improved.

In the substrate temperature elevation step, the plasma discharge in the process chamber 201 is stopped after lapse of a predetermined time, for example, of 40 sec to 60 sec and the supply of the $H_2$ gas is stopped. The plasma discharge may be stopped after the application of the high frequency power at the instance the effect of decreasing the difference of the temperature elevation rate or shortening of the temperature elevation time is obtained and it is not always necessary to maintain the plasma discharge over the entire period of the temperature elevation step.

As described above, in the third embodiment, also the plasma generation unit provides a function as the heating unit.

(Substrate Transferring Step)

After lapse of a predetermined time, the wafer 200 is transferred to the susceptor 217 and lifted to a predetermined position for the substrate surface processing by the same procedures as those of the substrate transfer step according to the second embodiment. Further, gases such as the $H_2$ gas and the active hydrogen species after the reaction of the $H_2$ gas in the process chamber 201 are exhausted to the outside of the process chamber 201. This can suppress the $H_2$ gas, etc. from remaining in the process chamber 201 and giving undesired effects on the subsequent step.

The difference of the substrate processing step according to the third embodiment from the second embodiment has been described.

As the method of decreasing the difference of the temperature elevation rate between the lower surface and the upper surface of the wafer 200 by heating the wafer 200 on the side of the upper surface thereof, other method than that using the plasmas may also be considered. For example, a gas heated to a predetermined temperature is jetted out from the shower head 236 above the wafer 200 and supplied to the process chamber 201. Then, the wafer 200 can be heated from the upper surface. According to this method, since the inside of the process chamber 201 is filled with the gas at the predetermined temperature to make the temperature at the periphery of the wafer 200 substantially constant and heat dissipation from the outer periphery of the wafer 200 is suppressed. This can also decrease the difference in the temperature elevation rate within the plane of the wafer 200. Accordingly, the temperature uniformity of the wafer 200 can be improved further. As described above, the gas supply unit also serves as the heating unit in the configuration.

Further, the wafer 200 is heated from above the wafer 200 also by using the lamp heating unit 280 as the lamp heating device described so far and this provides an effect of decreasing the difference of the temperature elevation rate between the lower surface and the upper surface of the wafer 200. With the view point described above, it can be said that the lamp heating unit 280 also serves as the heating unit.

(2) Effects According to the Third Embodiment

Also the third embodiment provides the same effects as those of the second embodiment.

(a) Further, when the temperature of the wafer 200 supported on the wafer projection pins 266 is elevated in the substrate temperature elevation step, the third embodiment supplies a gas giving no undesired effects on the substrate surface processing or an inert gas to the process chamber 201 by the gas supply unit. The supplied gas is excited by the plasma generation unit to generate plasmas above the wafer 200. This can elevate the temperature of the wafer 200 by heating using the heater 217b on the lower surface of the waver 200 and the plasma on the upper surface of the wafer 200 as the heat source. Accordingly, the difference of the temperature elevation rate between the upper surface and the lower surface of the wafer 200 can be decreased more to further improve the temperature uniformity of the wafer 200.

(b) Further, the third embodiment applies a high frequency power in the substrate temperature elevation step to ionize the gas giving no undesired effects on the substrate surface processing or the inert gas into plasmas. This can rapidly increase the temperature of the wafer 200 upon application of the high frequency power. Accordingly, the temperature of the wafer 200 can be elevated at a higher rate than that in the case of supplying the gas with no ionization into plasmas.

(c) Further, according to the third embodiment, a configuration of exciting and ionizing the $H_2$ gas into plasmas can be adopted in the substrate temperature elevation step. This can remove the spontaneous oxide film formed on the surface of the wafer 200 to improve the nitridation rate and the nitridation density in the plasma processing step.

Figure 6:
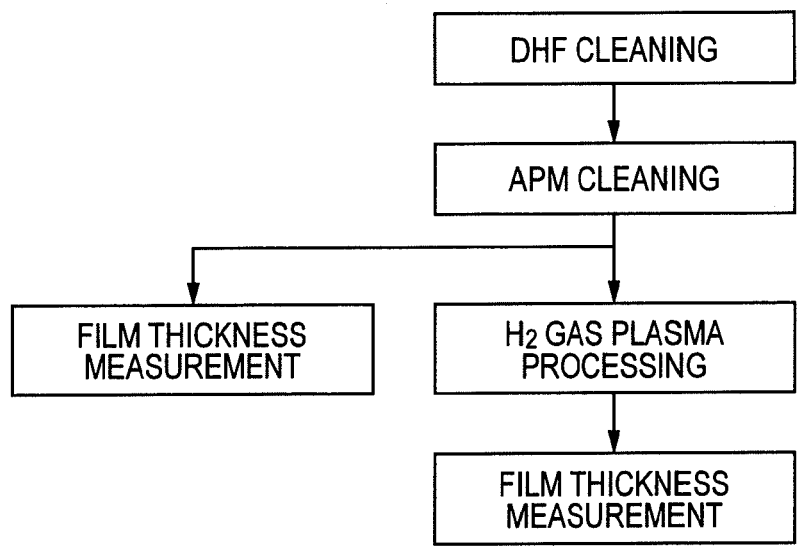
FIG. 6 is a flow chart showing a procedure of preparing samples in comparison between a case where the method of manufacturing a semiconductor device according to the first embodiment of the invention is applied and a case where it is not applied.
Figure 7:
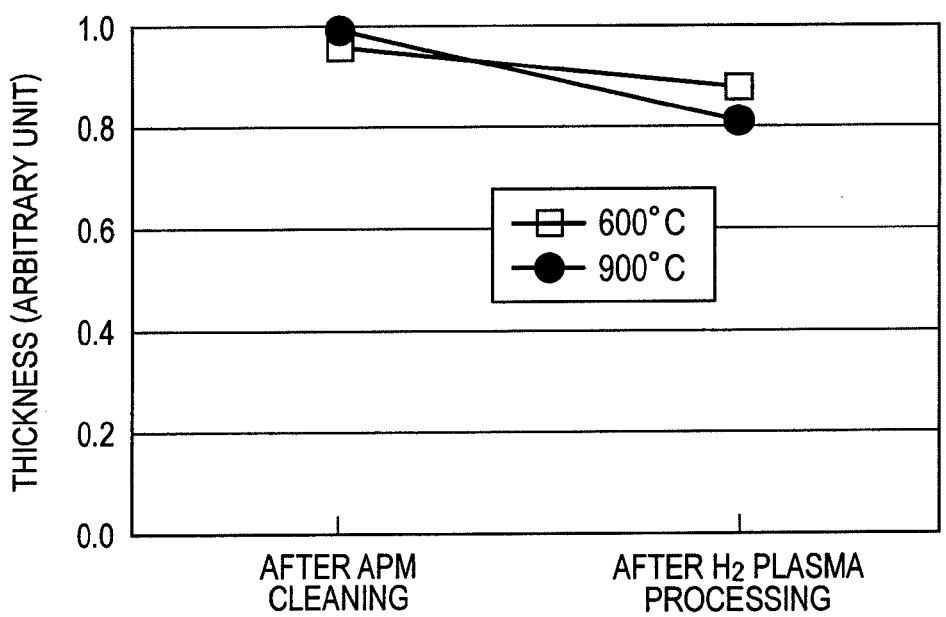
FIG. 7 is a graph showing the thickness of a spontaneous oxide film of samples in comparison between a case where the method of manufacturing a semiconductor device according to the first embodiment of the invention is applied and a case where it is not applied.

FIG. 7 shows measured values for the thickness of the spontaneous oxide film after AMP cleaning (ammonia hydrogen peroxide cleaning) of the silicon substrate sample manufactured by the flow shown in FIG. 6, and measured values for the thickness of the spontaneous oxide film after the $H_2$ gas plasma processing by the flow shown in FIG. 6 respectively. In FIG. 7, the ordinate denotes the thickness (arbitrary unit) of the spontaneous oxide film and the abscissa denotes the sample after the APM cleaning and the sample after the $H_2$ gas plasma processing.

For the sample after the APM cleaning, as the flow shown in FIG. 6, the thickness of the spontaneous oxide film is measured after the DHF cleaning (diluted hydrofluoric acid cleaning) and the APM cleaning. For the sample after the $H_2$ gas plasma processing, the thickness of the spontaneous oxide film is measured after the $H_2$ gas plasma processing which is performed after the DHF cleaning and the APM cleaning.

In the sample processed by the $H_2$ gas plasmas, data are obtained by setting the temperature of the heater 217b to 600° C. (shown by □ in the drawing) and 900° C. (shown by ● in the drawing) respectively in a state of directly placing the wafer 200 on the susceptor 217 for improving the experimental accuracy by controlling the temperature of the wafer 200. As shown in FIG. 7, the spontaneous oxide film can be removed by increasing the temperature of the heater 217b higher and performing the $H_2$ gas plasma processing.

In the third embodiment, since nitridation can be performed successively to the processing by the $H_2$ gas plasmas in one identical process chamber 201, the wafer 200 is not exposed to atmospheric air in the course of the process and the nitridation can be applied more efficiently.

(d) Further, the third embodiment can provide a configuration of exciting and ionizing the H$_2$ gas into plasmas in a state of supporting the wafer 200 on the wafer projection pins 266 while spacing apart from the susceptor 217. Since this can increase the distance between the wafer 200 and the impedance control electrode 217c and decrease the capacitance between the wafer 200 and the impedance control electrode 217c, the bias potential of the wafer 200 can be weakened. That is, a force of drawing active species in the plasmas into the wafer 200 can be weakened. Accordingly, even when an uneven pattern is formed to the wafer 200 and a spontaneous oxide film is further formed on the surface of the uneven pattern, the spontaneous oxide film formed on the bottom and the upper surface and the spontaneous oxide film formed on the lateral side of the uneven pattern can be removed uniformly.

(e) Further, the third embodiment can perform not only the temperature elevation of the wafer 200 but also the auxiliary processing such as removal of the spontaneous oxide film in the temperature elevation step. This can improve the efficiency in the substrate processing step to improve the productivity of the substrate processing.

(f) Further, the third embodiment can heat the wafer 200 from above by the heated gas or the lamp heating unit 280. This can further decrease the difference of the temperature elevation rate between the upper surface and the lower surface of the wafer 200.

(g) Further, in a case of using the heated gas, since the periphery of the wafer 200 is filled with the gas at a predetermined temperature, heat dissipation from the outer periphery of the wafer 200 can be suppressed to decrease also the difference of the temperature elevation rate within the plane of the wafer 200 and improve the temperature uniformity of the wafer 200 further.

Fourth Embodiment

Figure 8:
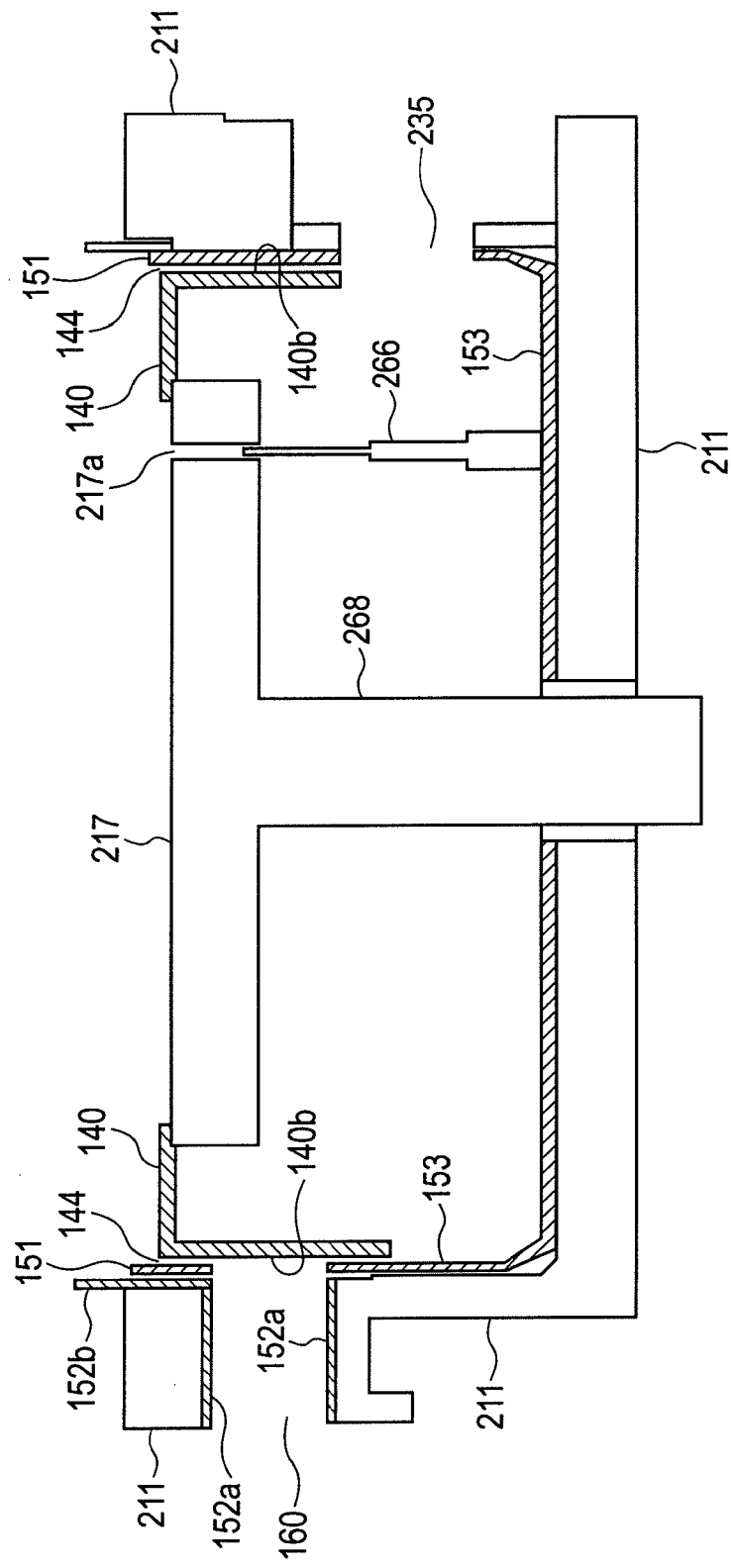
FIG. 8 is a vertical cross sectional view showing a structure and an arrangement of a gas flow restricting channel according to a fourth embodiment of the invention.
Figure 9:
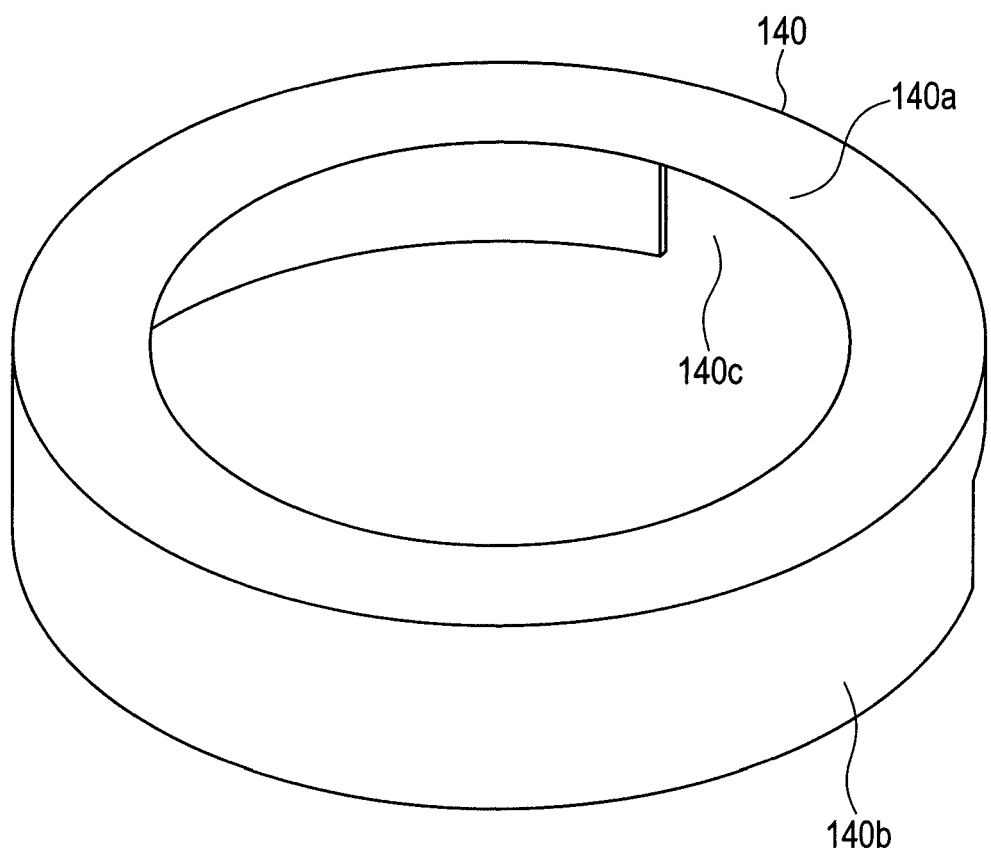
FIG. 9 is a perspective view of a cover defining a gas flow restricting channel according to the fourth embodiment of the invention.

A structure at the periphery of a susceptor 217 of a substrate processing apparatus according to a fourth embodiment of the invention is to be described with reference to FIG. 8 and FIG. 9. FIG. 8 is a vertical cross sectional view schematically showing the structure and the arrangement of a gas flow restriction channel 144 according to the fourth embodiment of the invention. FIG. 9 is a perspective view schematically showing a cover 140 forming the gas flow restriction channel 144 according to the fourth embodiment of the invention. In a substrate processing apparatus 100 of the fourth embodiment, the cover 140 is provided to the substrate processing apparatus 100 in the first to third embodiments.

As shown in FIG. 8, the gas flow restriction channel 144 is defined as a gap between a vertical part 140b of the cover 140 and a protective member 151 for the lateral side of the inner wall. The gas flow restriction channel 144 may also be defined as a gap between the vertical part 140b of the cover 140 and a protective member 152b for the lateral side of the wafer transport port.

The cover 140 protruding outward in the horizontal direction from the end of the upper surface of the susceptor 217 and forming the gas flow restriction channel 144 is provided to the susceptor 217. The cover 140 is formed, for example, of quartz. As shown in FIG. 9, the horizontal part 140a of the cover 140 is a ring-shaped plate having no holes and extending in the horizontal direction, which surrounds the peripheral end of the surface of the susceptor 217 for supporting the wafer 200. With such a structure, a horizontal plane contiguous with the wafer 200 can be formed to the periphery of the wafer 200, which can provide the same effect as in the case of extending the upper surface of the susceptor 217. That is, since a portion where the flow of the processing gas or the plasmas is uniform is extended, the processing uniformity within the plane of the wafer 200 can be improved.

A skirt-shaped vertical part 140b is formed to the outermost periphery of the horizontal part 140a being bended by degree from the horizontal part 140a and extended downward vertically. A portion of the vertical part 140b is recessed to form a recess 140c so as not to close the gas exhaustion port 235 during substrate processing. The recess 140c is formed corresponding to the position for the gas exhaustion port 235. Further, the vertical part 140b closes the wafer transport port 160 during substrate processing.

The distance between the cover 140 and the side wall of the lower vessel 211 in the horizontal direction is, for example, 1.0 mm or more and 2.5 mm or less. Specifically, the cover 140 is formed such that the gap between the outer surface of the vertical part 140b and the inner surface of the protective member 151 for the lateral side of the inner wall provided to the inner surface of the side wall of the lower vessel 211 is 1.0 mm or more and 2.5 mm or less. With a view point of the manufacturing accuracy, it is difficult to decrease the size of the gap to less than 1 mm. Further, the diameter of the susceptor 217 is made to a size larger than the size of the substrate placed on the susceptor 217 and this is, for example, about 340 mm. The radial width of the horizontal part 140a of the cover 140 is about 60 mm. The gas supplied in the process chamber 201 passes through the gap between the cover 140 and the lower vessel 211 and is exhausted from the gas exhaustion port 235 to the gas exhaustion pipe 231a.

As described above, since the gas is exhausted through a narrow gap, that is, exhausted through a portion difficult for exhaustion, plasmas per se are less leaked from the portion above the susceptor 217 to the lower vessel 211. Further, since the ionized gas is also maintained above the cover 140, the gas contributing, for example, to film deposition can be formed and maintained efficiently. In this case, since the exhaustion conductance (smoothness of exhaustion) of the space below the susceptor 217 is higher than the exhaustion conductance of the space above the substrate placing surface of the susceptor 217, the pressure above the substrate placing surface of the susceptor 217 in the process chamber 201 is higher than the pressure below the susceptor 217 in the process vessel 203. That is, the pressure above the susceptor 217 can be made higher than the pressure below the susceptor 217 and the plasma density above the susceptor 217 can be made higher by the cover 140.

Further, since the gas is exhausted from the entire circumference of the cover 140, the gas after processing flows uniformly in the direction from the periphery of the susceptor 217 to the bottom of the process vessel 203 and the flow rate of the gas flowing above the susceptor 217 can be made uniform in the circumferential direction of the susceptor 217 to ensure the uniformity of the film, for example, formed to the surface of the wafer 200.

Further, since the distance between the lateral side of the vertical part 140b of the cover 140 and the inner wall of the process chamber 201 is, for example, as narrow as 1.0 mm or more and 2.5 mm or less, the exhaustion conductance in the space from the substrate placing surface of the susceptor 217 to the lower side of the susceptor 217 is lower than the exhaustion conductance in the space above the susceptor 217. Accordingly, it takes a time for the activated gas constituting the plasmas generated in the space above the susceptor 217 to reach from the space above the substrate placing surface of the susceptor 217 to the periphery of the gate valve 244 and the gas is deactivated (loss of activity). Accordingly, this can prevent the active species or plasmas from attacking the gate valve 244 and can suppress the generation of impurities causing contamination.

Further, since the cover 140 extends as far as the inner wall of the process chamber 201 and is close to the wafer transport port 160, so that the gate valve 244 at the ground potential is impenetrable from the plasma generation region 224, plasmas can be restricted from being drawn to the gate valve 244 to improve the uniformity of processing and the active species or plasmas can be prevented from attacking the gate valve 244.

Further, by changing the position for the height of the susceptor 217, the uniformity of processing can be improved, the volume in the process chamber 201 can be changed while suppressing generation of contaminants, and the positional relation between the plasma generation region 224 and the wafer 200 can be controlled. As described above, the range for the process window (process condition) can be extended upon conducting processing such as film deposition.

Further, since it is configured such that the cover 140 does not close the gas exhaustion port 235, it is possible to control such that the exhaustion conductance of the space above the substrate placing surface of the susceptor 217 is lower than the exhaustion conductance in the space below the susceptor 217 while keeping the exhaustion conductance in the space below the susceptor 217 equal with that of the gas exhaustion portion 235 and contaminants, if generated below the susceptor 217, can be prevented from flowing to the portion above the susceptor 217.

Figure 10:
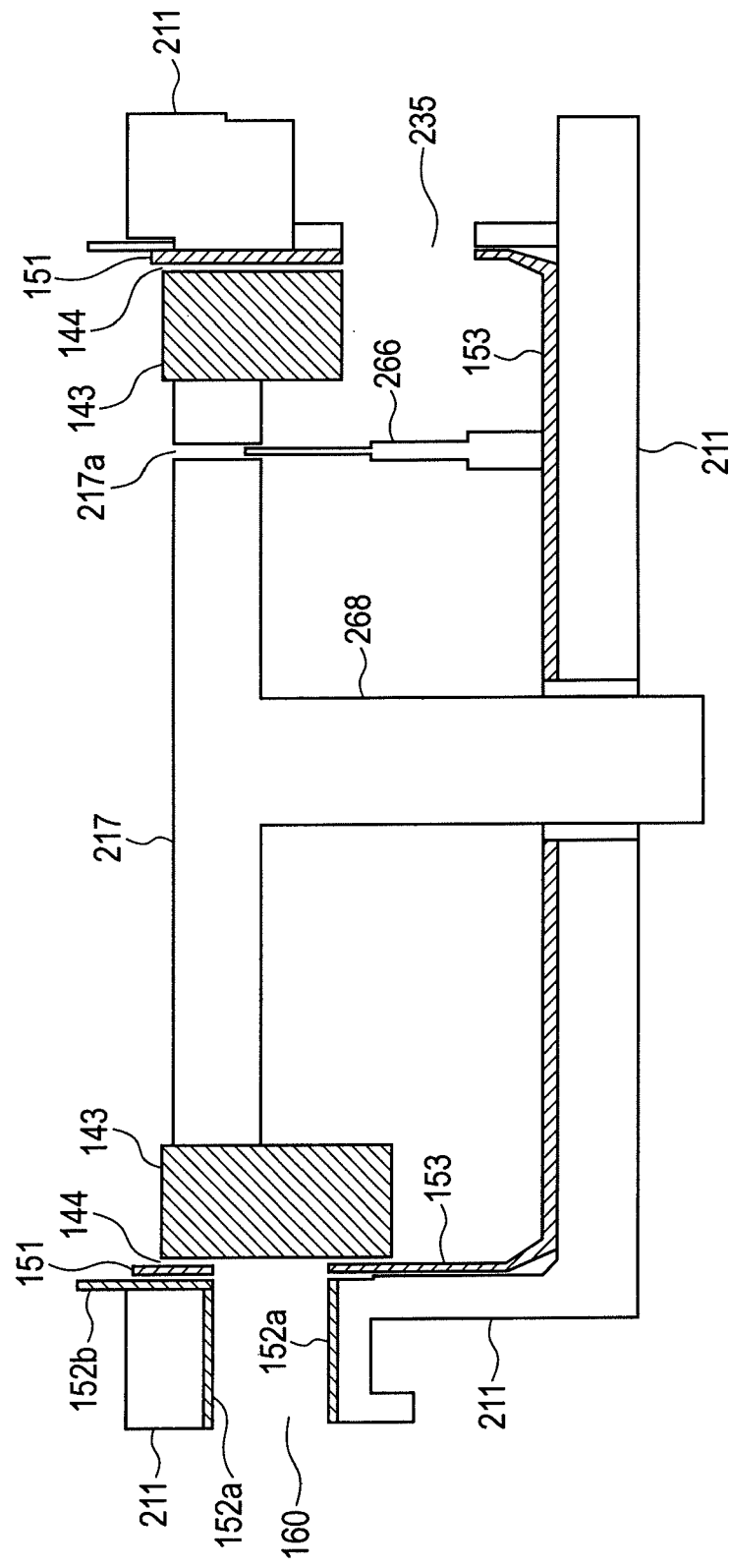
FIG. 10 is a vertical cross sectional view showing the modified example of the gas flow restricting channel according to the fourth embodiment of the invention.

In this embodiment, while the inner periphery of the horizontal part 140a of the cover 140 overlaps the outer peripheral end at the upper surface of the susceptor 217 and the cover 140 is provided so as to cover both the peripheral end of the upper surface and the lateral side of the susceptor 217, it may be also provided so as to cover either the upper surface end or the lateral side of the susceptor 217. When the cover 140 covers only the lateral side of the susceptor 217, it is configured such that the outer periphery of the susceptor 217 is close to the side wall of the lower vessel 211. Alternatively, as shown in the modified example of FIG. 10, a cover 143 for susceptor lateral side close to the side wall of the lower vessel 211 may be attached to the lateral side of the susceptor 217.

Further, as shown in FIG. 8, an insulator such as a protective member 151 for the lateral side of the inner wall formed of a non-metal material such as aluminum oxide or quartz is provided to the inside of the lower vessel 211 so as to be in contact with the side wall of the lower vessel 211, and a gas flow restriction channel 144 is provided between the protective member 151 and the cover 140. In such a structure, the exhaustion conductance in the space from the substrate placing surface of the susceptor 217 to the lower side of susceptor 217 is lower than the exhaustion conductance in the space above the susceptor 217. Accordingly, it takes a long time for the active gas constituting the plasmas generated above the susceptor 217 to reach from the portion above the susceptor to the vicinity of the gate valve 244 and the active gas is deactivated.

Further, at the inside of the wafer transport port 160, an insulator such as a protective member 152 for wafer transport port formed of a non-metal material such as aluminum oxide or quartz is provided so as to be in contact with the inner wall of the wafer transport port 160. Such a configuration can prevent the lower vessel 211 formed of metal from being exposed to the plasmas not deactivated completely in the channel between the vertical part 140b of the cover 140 and the protective member 151 on the lateral side of the inner wall. As a result, discharge of plasmas in the vicinity of the gate valve 244 can be suppressed further.

Further, a protective member 153 for the lower surface of the inner wall is provided to the bottom wall of the lower vessel 211. With such a configuration, the lower vessel 211 can be prevented from being exposed to the plasmas not deactivated completely in the channel between the vertical part 140b of the cover 140 and the protective member 151 for the lateral side of the inner wall. As a result, metal contamination of the lower vessel 211 caused by exposure to the plasmas can be prevented more reliably.

Figure 11:
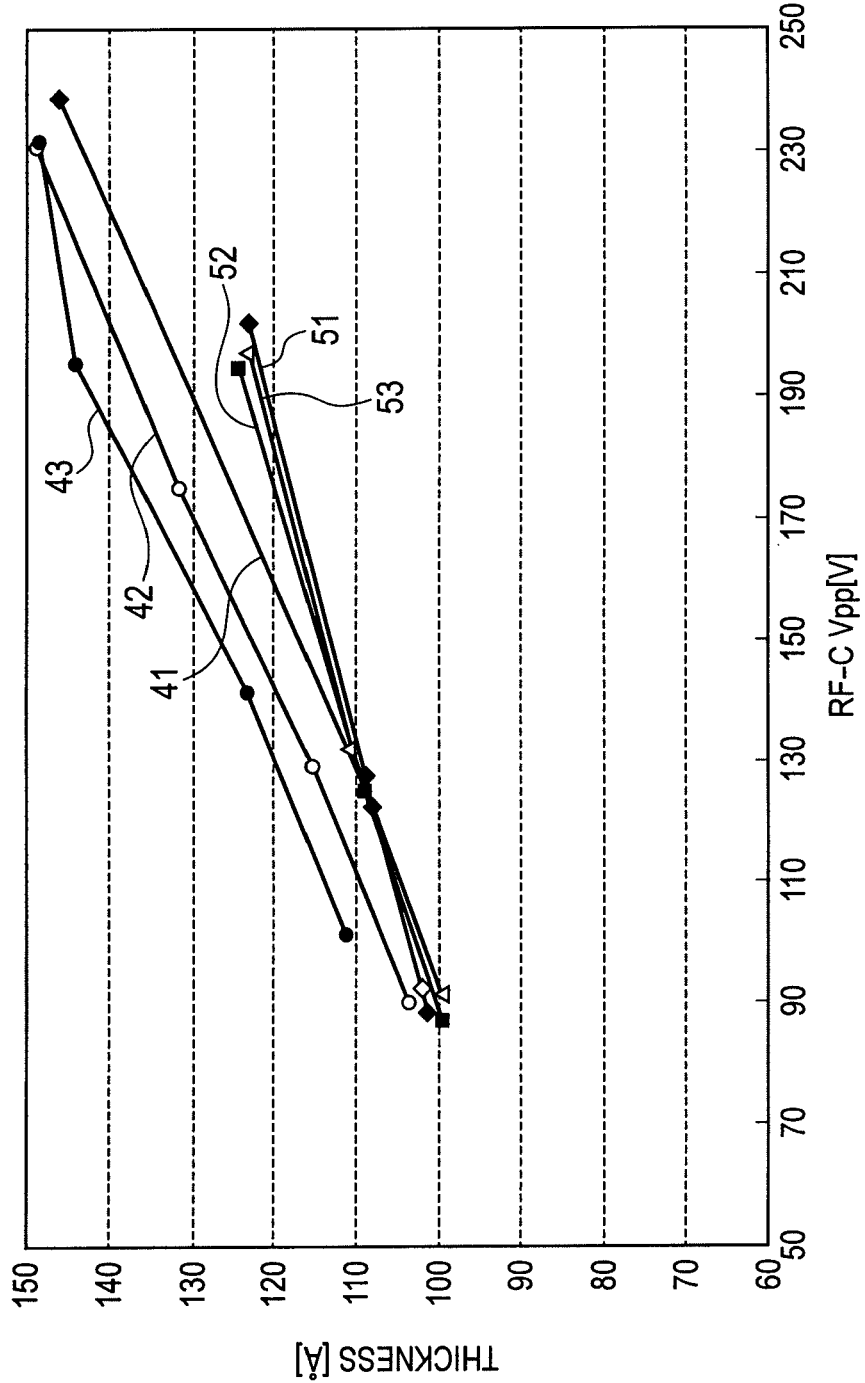
FIG. 11 is a graph showing a data for the thickness of film formed by using a substrate processing apparatus according to the fourth embodiment of the invention.

FIG. 11 shows the data for the thickness of the oxide film deposited by using the substrate processing apparatus according to the fourth embodiment of the invention and a comparative data. The gas supply unit in this case is configured so as to supply an oxygen gas and a hydrogen gas to the process chamber 201. Data in FIG. 11 are those obtained by setting the heater temperature to 900° C., the flow rate of the oxygen gas to 476 sccm, the flow rate of the hydrogen gas to 25 sccm, the power of the high frequency power source 273 to 2 kW, and the high frequency power application time to 240 sec. The abscissa denotes a voltage (V) when controlling the voltage of the susceptor 217 by using a variable impedance mechanism 274 and the ordinate denotes a film thickness (Å). 41 to 43 represent data for the thickness of the film formed by using the substrate processing apparatus according to the fourth embodiment, which are obtained by setting the distance between the cover 140 and the side wall of the lower vessel 211 to 2.5 mm. 41 represents data for the pressure in the process chamber 201 of 180 Pa, 42 represents data for the pressure in the process chamber 201 of 220 Pa, and 43 represents data for the pressure in the process chamber 201 of 260 Pa.

51 to 53 represent comparative data, which are data for the thickness of oxide films formed by using existent substrate processing apparatus in which the distance between the cover 140 and the side wall of the lower vessel 211 is about 2.5 mm and plural holes each of about 6 mm diameter are arranged at the outer periphery of the cover 140, 51 represents data for the pressure in the process chamber 201 of 180 Pa, 52 represents data for the pressure in the process chamber 201 of 220 Pa, and 53 represents data for the pressure in the press chamber 201 of 260 Pa.

It can be seen from FIG. 11, that in the fourth embodiment the thickness of the film can be increased in an identical processing time, that is, the processing rate can be improved more than that of the existent substrate processing apparatus.

While the oxygen gas and the hydrogen gas are used as the reaction gas in the fourth embodiment, a nitrogen gas, an ammonia gas, etc. can be used as the reaction gas in accordance with the content of processing.

The fourth embodiment provides one or plural the following effects.

(a) Since the gas flow restriction channel is provided to the end of the substrate support unit, flow of the excited processing gas generated above the substrate support unit can be restricted from flowing in the direction below the substrate support unit and the processing gas flowing in the direction below the substrate support unit can be deactivated. Thus, since the exhaustion speed of the plasmas (active species of the processing gas) formed above the substrate support unit is lowered, the gas contributing to the film formation can be generated and maintained efficiently to improve the processing rate.

(b) When the distance between the gas flow restriction channel and the inner wall of the process chamber, that is, the distance between the outmost periphery of the cover and the inner wall of the process chamber is made 1.0 mm or more and 2.5 mm or less, since the exhaustion speed of the plasmas formed above the substrate support unit can be easily lowered, the gas contributing to film formation can be generated and maintained at higher efficiency to improve the processing rate.

(c) When the gas flow restriction channel is formed as a gap between the cover provided so as to cover either one or both of the upper surface end and the lateral side of the substrate support unit and the protective member provided to the inner wall of the process chamber, disturbance of the flow of the processing gas flowing at the surface of the substrate placed on the substrate support unit is suppressed and uniform processing in the substrate can be conducted easily by covering the end of the upper surface of the substrate support unit by the cover. Further, since a stable gas channel directing to the gas exhaustion port is formed by covering the lateral sides of the substrate support unit with the cover, disturbance of the flow of the processing gas flowing at the surface of the substrate placed on the substrate support unit is further suppressed and, plasmas are suppressed from attacking the metal material such as the transporting port for loading and unloading the substrate, and generation of impurities causing contamination is suppressed.

(d) Since the gas flow restriction channel is provided to the end of the substrate support unit, the exhaustion conductance above the substrate support unit is decreased to lower than the exhaustion conductance below the substrate support unit, the pressure above the substrate support unit can be increased. Accordingly, when the substrate temperature elevation step in the first to third embodiments is performed in the substrate processing apparatus of the fourth embodiment, the temperature of the substrate can be elevated further at a higher rate.

Fifth Embodiment

Then, a substrate processing apparatus of a fifth embodiment according to the invention is to be described.

In the substrate processing apparatus of the fifth embodiment, the cover 140 for the substrate processing apparatus of the fourth embodiment is replaced with a cover 142. Since other components are identical with those of the substrate processing apparatus of the fourth embodiment, descriptions for them are to be omitted.

Figure 12:
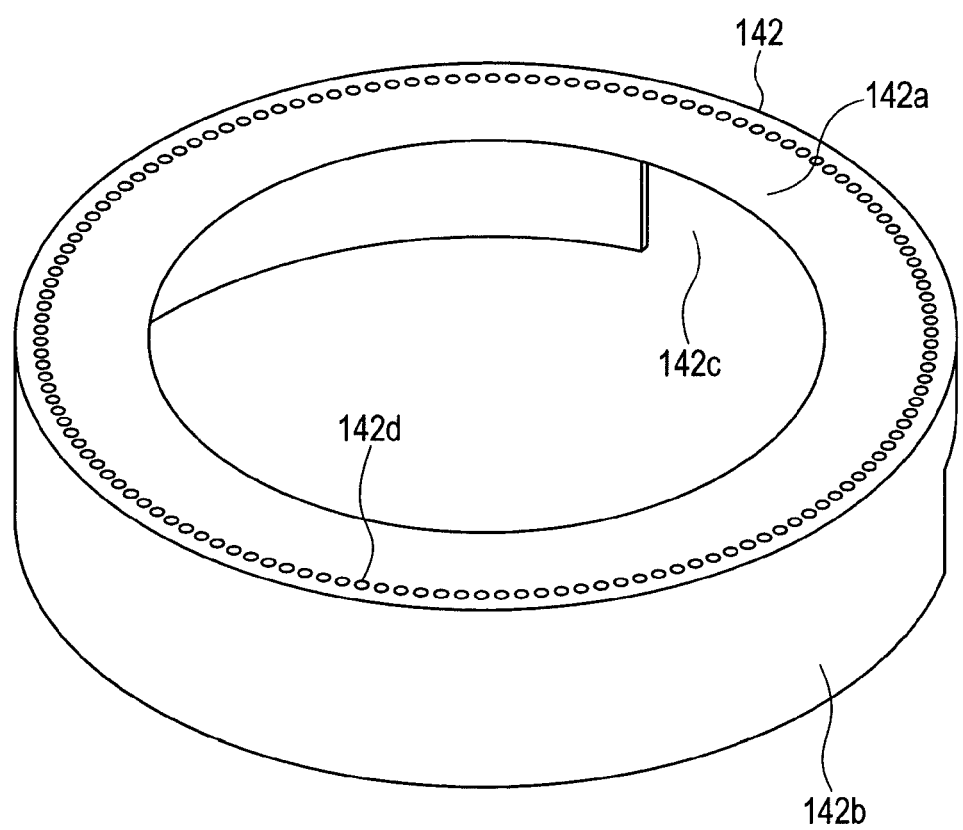
FIG. 12 is a perspective view of a cover constituting a gas flow restricting channel according to a fifth embodiment of the invention.

As shown in FIG. 12, holes 142d for exhaustion are apertured in the outermost periphery of the horizontal part 142a of a cover 142. FIG. 12 is a perspective view of the cover 142 forming a gas flow restriction channel according to the fifth embodiment of the invention. Holes 142d are small holes each having a diameter of 1 mm or more and 6 mm or less which are present in plurality over the entire outer periphery of the cover. The diameter of the hole 142d is smaller than that of the hole in the cover of the existent apparatus. Further, the gap between the cover and the side wall of the vessel is larger than 2.5 mm in the same manner as in the existent apparatus. The supplied gas is exhausted through the gap and the holes 142d. Thus, the gas after processing flows uniformly in the direction from the periphery of the susceptor 217 to the bottom of the process vessel 203 and is exhausted from the exhaustion port 235 formed in the lower vessel 211. The gap between the cover and the inside of the lateral wall of the vessel can be made 1.0 mm or more and 2.5 mm or less in the same manner as in the fourth embodiment. Further, instead of making the diameter of the holes 142d smaller, the thickness of the cover may be increased to make the hole 142d longer thereby lowering the exhaustion conductance. Further, the exhaustion conductance may be lowered by decreasing the number of the holes 142d.

Since the gas is exhausted through the narrow gap and the small holes 142d, the plasmas or ionized gas is maintained above the cover 142 and less leaked toward the lower vessel 211 also by the cover 142 of the fifth embodiment in the same manner as the cover 140 of the fourth embodiment. Accordingly, the gas contributing, for example, to the film formation can be generated and maintained efficiently. That is, the pressure above the susceptor 217 can be increased to higher than the pressure below the susceptor 217 and the plasma density above the susceptor 217 can be increased by the cover 142.

Further, since the gas is exhausted from the entire periphery of the cover 142, the gas after processing flows uniformly from the periphery of the susceptor 217 to the bottom of the process vessel 203. Accordingly, the flow rate of the gas flowing on the susceptor 217 can be made uniform in the circumferential direction of the susceptor 217 and the uniformity of the film formed to the wafer 200 can be ensured within the plane of the wafer.

The fifth embodiment provides, the following effects.

(a) Since small holes each having a diameter of 1 mm or more and 6 mm or less are formed over the entire outer circumference of the horizontal surface of the cover, the exhaustion speed of the plasmas formed above the substrate support unit is lowered and the gas contributing to the film formation can be generated and maintained efficiently to improve the processing rate. Further, disturbance of the flow of the processing gas flowing on the surface of the substrate placed on the substrate support unit can be suppressed to facilitate uniform processing within the plane of the substrate.

(b) Since the exhaustion conductance above the substrate support unit is made lower than the exhaustion conductance below the substrate support unit, the pressure above the substrate support unit can be increased. Accordingly, when the substrate temperature elevation step in the first to third embodiments is performed by the substrate processing apparatus of the fifth embodiment, the temperature of the substrate can be elevated at a higher rate.

Other Embodiments of the Invention

While each of the embodiments of the invention has been described specifically, the invention is not restricted to each of the embodiments and can be modified variously within a range not departing from the gist thereof.

For example, in the first to third embodiments, while the wafer 200 supported on the wafer projection pins 266 is transferred onto the susceptor 217 by lifting the susceptor 217, the wafer 200 may be transferred onto the susceptor, for example, also by providing a driving mechanism to the wafer projection pins for lifting and lowering them and the wafer 200 may be transferred on the susceptor by lowering the wafer projection pins. Further, in the embodiments, while the susceptor 217 is lowered when the wafer 200 is supported on the wafer projection pins 266, the wafer 200 may be supported on the wafer projection pins by lifting the wafer projection pins. This can simplify the mechanism for lifting operation further than the lifting operation of the susceptor 217 to save the consumption power of the substrate processing apparatus. Further, the driving mechanism for lifting, etc. may be provided to the susceptor and the wafer projection pins respectively, so that both of the susceptor and the wafer projection pins conduct lifting operation and they respectively conduct lifting operation relatively.

Further, in the first to third embodiments, while the wafer 200 is supported being spaced apart from the susceptor 217 by the wafer projection pins 266 in the substrate temperature elevation step, the wafer 200 may be supported not only by the wafer projection pins 266 but also the wafer 200 may be supported being spaced apart from the susceptor, for example, by suspending and supporting the wafer 200 above the susceptor while spacing apart by a predetermined distance, or by stopping the transporting mechanism for loading the wafer 200 into the process chamber 201 above the susceptor for a predetermined time.

Further, unevenness fabrication (embossing fabrication) may be applied to the upper surface of the susceptor and wafer 200 may also be supported on the convex portions at the upper surface of the susceptor when the wafer 200 is transferred from the wafer projection pins 266 to the susceptor. This can suppress abrupt heating of the wafer 200 when the wafer 200 is transferred to the susceptor. Further, since the area of contact between the susceptor and the wafer 200 is decreased, generation of particles can be suppressed. Further, lateral slip of the wafer 200 can be suppressed when the wafer 200 is placed. Further, scratches, etc. formed at the rear face of the wafer 200 can be decreased. Further, warp of the wafer 200 can be decreased.

Further, as has been described above, the heater 217*b* provided to the susceptor 217, the lamp heating unit 280, the plasma generation unit, the gas supply unit for supplying heated gas, etc. can be used as the heating unit. In this case, the heating unit may be one of the heater 217*b*, the lamp heating unit 280, the plasma generation unit, and the gas supply unit, or may be a combination of several or all of them. In each of the combinations, the temperature circumstance for the upper and the lower surfaces of the wafer 200 can be made uniform by supporting the wafer 200 being spaced apart from the susceptor 217 or property controlling the distance between the susceptor 217 and the wafer 200 in the substrate temperature elevation step. Accordingly, difference of the temperature elevation rate less occurs between the upper and lower surfaces and the temperature uniformity of the wafer 200 can be improved.

Further, the gas supplied to the process chamber 201 to increase the pressure or the gas to be ionized into plasmas in the substrate temperature elevation step is not restricted to the $N_2$ gas or the $H_2$ gas shown in the embodiments but can be selected optionally depending on the contents of the substrate surface processing or the surface state of the wafer 200 (formation of predetermined film or not). Several specific examples are shown below.

For example, in the nitridation of the Si surface or the silicon oxide film ($SiO_2$ film) of the wafer 200, a rare gas that is an Ar gas, a $H_e$ gas, and a Kr gas, etc. may be used, for example, in addition to the $N_2$ gas and the $H_2$ gas. However, an $O_2$ gas is not preferred since $O_2$ may possibly remain in the process chamber 201 to lower the nitridation efficiency.

Further, for oxidation of Si, etc., an $N_2$ gas, an $O_2$ gas, an $H_2$ gas, a rare gas, etc. may be used. However, use of the $H_2$ gas is not preferred in the formation of a gate oxide film of a semiconductor device such as a flash memory since the $H_2$ gas is taken into the gate oxide film to possibly worsen the electric characteristic.

Further, for annealing, an $N_2$ gas, a rare gas, etc. may be used. However, a gas such as an $O_2$ gas or an $H_2$ gas that may possibly oxidize or reduce the wafer 200 or the film formed on the wafer 200 at a high temperature during annealing is not preferred.

Further, when selective oxidation of oxidizing the poly-Si film without oxidizing the metal film is performed to a laminate structure of a poly-Si film comprising $SiO_2$ and a metal film, an $N_2$ gas, an $O_2$ gas, a $H_2$ gas, a rare gas, etc. may be used and, upon various film deposition using CVD (Chemical Vapor Deposition), an $N_2$ gas or a rare gas can be used.

In each of the substrate surface processing, the heat conduction efficiency can be improved more by using a gas, for example, an He gas having small molecular weight and molecular size.

Further, the present invention is applicable not only to the substrate surface processing described above but also to substrate surface processing such as oxynitridation of performing oxidation and nitridation together, diffusion, etching, annealing, etc. to a bare wafer or a wafer where various kinds of films are formed. The substrate surface processing can be performed by using or not using plasmas.

Further, in the embodiments, while processing applied to the wafer has been described, the target for processing may also be a photomask, a printed wiring board, a liquid crystal panel, a compact disk, a magnetic disk, etc.

The present specification includes at least the following aspects of the invention.

A first aspect of the invention provides a substrate processing apparatus including:

a process chamber for processing a substrate, a first substrate support unit for supporting the substrate loaded into the process chamber, a second substrate support unit provided in the process chamber for supporting the substrate transferred from the first substrate support unit, a heating unit for heating the substrate loaded into the process chamber, a control unit for controlling the first substrate support unit and the heating unit or controlling the second substrate support unit and the heating unit for supporting the substrate loaded into the process chamber on the first substrate support unit so as to be spaced apart from the second substrate support unit, heating to elevate the temperature of the substrate supported on the first substrate support unit by the heating unit, transferring the substrate supported on the first substrate support unit after lapse of a predetermined time to the second substrate support unit, and processing the substrate supported on the second substrate support unit while heating by the heating unit.

A second aspect according to the first aspect, wherein the control unit is adapted supporting the substrate loaded into the process chamber on the first substrate support unit above the second substrate support unit.

A third aspect according to the first or second aspect, wherein the distance between the substrate supported on the first substrate support unit and the second substrate support unit is controlled in accordance with the difference between the temperature of the substrate and the temperature of the second substrate support unit heated to a predetermined temperature by the heating unit upon loading the substrate into the process chamber.

A fourth aspect according to the first to third aspects wherein a gas supply unit for supplying a gas in the process chamber and a gas exhaustion unit for exhausting the gas from the inside of the process chamber are provided, in which the control unit is adapted for controlling the gas supply unit and the gas exhaustion unit, upon elevation of the temperature of the substrate supported on the first substrate support unit, by supplying a gas to the process chamber by the gas supply unit thereby increasing the pressure in the process chamber to higher than the pressure when the substrate is loaded, or the pressure when the substrate supported on the second substrate support unit is processed.

A fifth aspect according to the fourth aspect, wherein the heating unit includes a plasma generation unit for exciting the gas supplied to the process chamber, and the control unit is adapted for controlling the plasma generation unit so as to excite the gas supplied from the gas supply unit by the plasma generation unit upon elevation of the temperature of the substrate supported on the first substrate support unit.

A sixth aspect according to the fifth aspect, wherein a hydrogen-containing gas is used as the gas supplied from the gas supply unit upon elevation of the temperature of the substrate supported on the first substrate support unit in a case where a spontaneous oxide film is formed on the surface of the substrate loaded into the process chamber.

A seventh aspect according to the first to sixth aspects, wherein the heating unit includes a lamp heating device provided above the first substrate support unit, and the control unit is adapted for controlling the lamp heating device so as to heat the substrate supported on the first substrate support unit from above by the lamp heating device upon elevation of the temperature of the substrate supported on the first substrate support unit.

An eighth aspect according to the first to seventh aspects, wherein the second substrate support unit has through holes in which the first substrate support unit is passed through vertically, and the control unit is adapted for inserting the first substrate support unit through the through holes and supporting the substrate at a position above the upper surface of the second substrate support unit when the substrate loaded into the process chamber is supported on the first substrate support unit, and positioning the first substrate support unit below the upper surface of the second substrate support unit and supporting the substrate on the second substrate support unit when the substrate supported on the first substrate support unit is transferred to the second substrate support unit.

A ninth aspect according to the eighth aspect, wherein the second substrate support unit has convex portions formed to the surface for supporting the substrate, and the control unit is adapted for supporting the substrate on the convex portions of the second substrate support unit when the substrate supported on the first substrate support unit is transferred to the second substrate support unit.

A tenth aspect provides a method of manufacturing a semiconductor device including the steps of:

loading a substrate into a process chamber for processing the substrate and supporting the substrate on a first substrate support unit, elevating the temperature of the substrate supported on the first substrate support unit for a predetermined time, transferring the substrate supported on the first substrate support unit to a second substrate support unit provided in the process chamber after the step of elevating the temperature of the substrate, processing the surface of the substrate transferred to the second substrate support unit while heating, and unloading the substrate processed in the step of processing the surface of the substrate from the inside of the process chamber.

A 11th aspect according to the tenth aspect, wherein the substrate loaded into the process chamber in the step of loading the substrate is supported on the first substrate support unit above the second substrate support unit so as to be spaced apart from the second substrate support unit.

A 12th aspect according to the tenth or 11th aspect, wherein the distance between the substrate supported on the first substrate support unit and the second substrate support unit is controlled in accordance with the difference of the temperature between the temperature of the substrate and the temperature of the second substrate support unit heated to a predetermined temperature by the heating unit when the substrate is loaded into the process chamber.

A 13th aspect according to the tenth to 12th aspects, wherein a gas is supplied to the process chamber and the pressure in the process chamber is increased in the step of elevating the temperature of the substrate to higher than the pressure in the step of loading the substrate or the pressure in the step of processing the surface of the substrate.

A 14th aspect according to the 13th aspect, wherein the gas supplied in the process chamber is ionized into plasmas and excited in the step of elevating the temperature of the substrate.

A 15th aspect according to the 14th aspect, wherein a hydrogen-containing gas is supplied to the process chamber and the hydrogen-containing gas is ionized into plasmas and excited in the step of elevating the temperature of the substrate in a case where a spontaneous oxide film is formed on the surface of the substrate loaded into the process chamber.

A 16th aspect according to the tenth to 15th aspects, wherein the substrate supported on the first substrate support unit is heated from above by a lamp in the step of elevating the temperature of the substrate.

A 17th aspect provides a substrate processing apparatus comprising:

a process chamber provided with a substrate support unit (second substrate support unit) for supporting the substrate, a gas supply unit for supplying a processing gas from above the substrate support unit to the process chamber, a plasma generation unit for exciting the processing gas supplied to the process chamber, a gas exhaustion unit provided below the substrate support unit for exhausting the gas in the process chamber, a gas flow restriction channel provided to the end of the substrate support unit for restricting the flow of the excited processing gas generated above the substrate support unit in the direction below the substrate support unit thereby deactivating the processing gas flowing in the direction below the substrate support unit, and a protective member provided to the inner wall of the process chamber at least below the substrate placing surface of the substrate support unit.

A 18th aspect provides a substrate processing apparatus including:

a process chamber provided with a substrate support unit (second substrate support unit) for supporting the substrate, a gas supply unit for supplying a processing gas from above the substrate support unit to the process chamber, a plasma generation unit for exciting the processing gas supplied to the process chamber, a gas exhaustion unit provided below the substrate support unit for exhausting the gas in the process chamber, and a gas flow restriction channel provided to the end of the substrate support unit, and formed such that the distance relative to the inner wall of the process chamber is 1.0 mm or more and 2.5 mm or less.

A 19th aspect according to the 17th or 18th aspect, provides a substrate processing apparatus wherein the gas flow restriction channel is a channel between a cover provided so as to cover one or both of the end of the upper surface and the lateral side of the substrate support unit and a protective member provided to inner wall of the process chamber.

A 20th aspect provides a substrate processing apparatus including:

a process chamber provided with a substrate support unit (second substrate support unit) for supporting the substrate, a gas supply unit for supplying a processing gas from above the substrate support unit to the process chamber, a plasma generation unit for exciting the processing gas supplied to the process chamber, a gas exhaustion unit provided below the substrate support unit for exhausting the gas in the process chamber, and a cover for covering the end of the upper surface of the substrate support unit in which holes each having a diameter of 1 mm or more and less than 6 mm are formed over the entire outer circumference of the horizontal surface of the cover.

A 21th aspect according to the 20th aspect provides a substrate processing apparatus wherein the cover is provided so as to cover both the end of the upper surface and the lateral side of the substrate support unit.

A 22th aspect provides a method of manufacturing a semiconductor device including the steps of:

loading a substrate into a process chamber provided with a protective member to the inner wall of a process chamber at least below the substrate placing surface of a substrate support unit (second substrate support unit), supporting the substrate on the substrate support unit provided with a gas flow restriction channel for restricting a gas flow at the end thereof, supplying a processing gas to the process chamber from the gas supply unit, exciting the processing gas supplied to the process chamber by a plasma generation unit, exhausting the gas in the process chamber from below the substrate support unit, and unloading the substrate from the process chamber.

A 23th aspect provides a method of manufacturing a semiconductor device including the steps of:

loading a substrate into a process chamber, supporting the substrate loaded into the process chamber by a substrate support unit (second substrate support unit) provided in the process chamber and having a gas flow restriction channel provided at the end of the substrate support unit and formed such that the distance relative to the inner wall of the process chamber is 1.0 mm or more and 2.5 mm or less.

supplying a processing gas from above the substrate supporting unit to the process chamber, exciting the processing gas supplied to the process chamber, exhausting the gas in the process chamber from below the substrate support unit, and unloading the substrate from the process chamber.

A 24th aspect provides a method of manufacturing a semiconductor device including the steps of:

loading a substrate into a process chamber, supporting the substrate loaded into the process chamber on a substrate support unit (second substrate support unit) provided in the process chamber and having a cover for covering the end of the upper surface of the substrate support unit in which holes are formed each having a diameter of 1 mm or more and less than 6 mm over the entire outer circumference of the horizontal surface of the cover, supplying a processing gas from above the substrate supporting unit to the process chamber, exciting the processing gas supplied to the process chamber, exhausting the gas in the process chamber from below the substrate support unit, and unloading the substrate from the process chamber.

A 25th aspect provides a method of manufacturing a semiconductor device including the steps of:

loading a substrate into a process chamber and supporting the substrate on a substrate support unit (second substrate support unit) in the process chamber, supplying a processing gas from above the substrate support unit to the process chamber, exciting the processing gas supplied to the process chamber, flowing a gas above the substrate support unit in the direction below the substrate support unit from a gas flow restriction channel in which the distance between the substrate support unit and the inner wall of the process chamber is 1.0 mm or more and 2.5 mm or less, exhausting the gas in the process chamber from below the substrate support unit, and unloading the substrate from the process chamber.

A 26th aspect provides a method of manufacturing a semiconductor device including the steps of:

loading a substrate into a process chamber and supporting the substrate on a substrate support unit (second substrate support unit) in the process chamber, supplying a processing gas from above the substrate support unit to the process chamber, exciting the processing gas supplied to the process chamber, flowing a gas above the substrate support unit in the direction below the substrate support unit from holes each having a diameter of 1 mm or more and less than 6 mm formed over the entire outer circumference of the horizontal surface of the cover covering the end of the upper surface of the substrate support unit, exhausting the gas in the process chamber from below the substrate support unit, and unloading the substrate from the process chamber.

Any one of the 17th aspect to 21th aspect can be combined with any one of the first aspect to the ninth aspect of the substrate processing apparatus. Further, any one of the 22th aspect to the 26th aspect can be combined with any one of the tenth aspect to 16th aspect of the method of manufacturing the semiconductor device. With such a combined configuration, since the exhaustion conductance above the substrate support unit is lower than the exhaustion conductance below the substrate support unit, the pressure above the substrate support unit can be increased. Accordingly, the temperature of the substrate can be elevated more rapidly in the substrate temperature elevation step.

What is claimed is:

1. A method of processing a substrate comprising steps of:
   loading a substrate into a process chamber,
   supporting the substrate loaded into the process chamber above a predetermined distance apart from a suceptor by a substrate support unit,
   elevating the temperature of the substrate supported the predetermined distance apart from the suceptor by the substrate support unit, by a heating unit established in the suceptor during a predetermined time in the state of providing pressure in the process chamber that is higher than the pressure in the step of loading the substrate before transferring the substrate to the suceptor,
   transferring the substrate supported on the substrate support unit to the suceptor and supporting the substrate on a top surface of the suceptor after the step of elevating the temperature passed the predetermined time,
   processing a surface of the substrate, transferred to the suceptor and supported on the top surface of the suceptor, by gas while heating by the heating unit in the state of supplying the gas into the process chamber and providing the pressure in the process chamber a predetermined pressure, and
   unloading the substrate processed in the step of processing of the substrate from an inside of the process chamber.

2. The method of processing a substrate according to claim 1, Wherein
   in step of elevating the temperature of the substrate, the pressure in the process chamber is increased by supplying a gas from a gas supply unit to the process chamber.

3. The method of processing a substrate according to claim 2, wherein
   in step of elevating the temperature of the substrate, the process chamber is done for the predetermined pressure that is higher than the pressure in the step of loading the substrate by making the gas flow supplied in step of elevating the temperature of the substrate a predetermined value.

4. The method of processing a substrate according to claim 2, wherein
   the gas supplied in step of elevating the temperature of the substrate is a nitrogen gas.

5. The method of processing a substrate according to claim 1, wherein
   the gas supplied in step of elevating the temperature of the substrate is supplied between the substrate and the suceptor.

6. The method of processing a substrate according to claim 1, wherein
   in step of supporting the substrate, the predetermined distance between the substrate and the suceptor is adjusted according to a difference with the temperature of the substrate and the temperature of the susceptor.

7. The method of processing a substrate according to claim 6, wherein
   the predetermined distance between the substrate and the suceptor is reduced when a difference with the temperature of the substrate and the temperature of the susceptor is small, and
   the predetermined distance between the substrate and the suceptor is raised when a difference with the temperature of the substrate and the temperature of the susceptor is big.

8. The method of processing a substrate according to claim 1, wherein
   in step of elevating the temperature of the substrate, further a top surface of the substrate is heated by a heating unit established above of the substrate.

* * * * *